(12) United States Patent
Torossian et al.

(10) Patent No.: US 7,567,893 B2
(45) Date of Patent: Jul. 28, 2009

(54) CLOCK SIMULATION SYSTEM AND METHOD

(75) Inventors: James R. Torossian, Whale Beach (AU); Neville A. Clark, Quorrobolong (AU)

(73) Assignee: VaST Systems Technology Corporation, Sunnyvale, CA (US)

( * ) Notice: Subject to any disclaimer, the term of this patent is extended or adjusted under 35 U.S.C. 154(b) by 465 days.

(21) Appl. No.: 11/315,683

(22) Filed: Dec. 20, 2005

(65) Prior Publication Data

US 2006/0149526 A1 Jul. 6, 2006

Related U.S. Application Data

(60) Provisional application No. 60/640,391, filed on Dec. 30, 2004.

(51) Int. Cl.
*G06F 17/50* (2006.01)

(52) U.S. Cl. ............... 703/16; 703/17; 703/18; 716/1; 716/4; 716/6

(58) Field of Classification Search ............. 703/16–18; 716/1, 4, 6
See application file for complete search history.

(56) References Cited

U.S. PATENT DOCUMENTS

| | | | |
|---|---|---|---|
| 6,044,211 A * | 3/2000 | Jain | 716/18 |
| 6,152,612 A * | 11/2000 | Liao et al. | 703/23 |
| 6,263,302 B1 | 7/2001 | Hellestrand et al. | 703/17 |
| 6,751,583 B1 | 6/2004 | Clarke et al. | 703/17 |
| 2002/0083420 A1 | 6/2002 | Zammit et al. | 717/135 |
| 2004/0088150 A1 | 5/2004 | Gay | 703/14 |
| 2004/0111247 A1 | 6/2004 | Berevoescu et al. | 703/19 |

OTHER PUBLICATIONS

Kamal S. Khouri and Niraj K. Jha, "Clock Selection for Performance Optimization of Control-Flow Intensive Behaviors", Ieee Transactions on Computer-Aided Design of Integrated Circuits and Systems, vol. 20, No. 1, Jan. 2001.
Written Opinion of the International Searching Authority dated Jul. 18, 2008.
International Preliminary Report on Patentability dated Mar. 3, 2009.

* cited by examiner

Primary Examiner—Paul L Rodriguez
Assistant Examiner—Dwin M Craig
(74) Attorney, Agent, or Firm—Sterne, Kessler, Goldstein & Fox PLLC

(57) ABSTRACT

A simulation system, a computer product to implement a simulation method, and a method of simulating a digital circuit that has at least one element and at least one clock signal having clock attributes. The method includes maintaining a data structure for time-scheduled events scheduled to occur at particular simulation-times; and maintaining a data structure for clock-scheduled events each corresponding to a particular clock signal and scheduled to occur at a time that can be determined from at least one attribute of the clock signal, such that clocked-scheduled events are distinguishable from time-scheduled events, and such that each and every transition of any clock signal need not be scheduled in the time-scheduled event data structure.

39 Claims, 5 Drawing Sheets

CLOCK SIMULATION SYSTEM AND METHOD

RELATED PATENT APPLICATIONS

The present invention claims benefit of U.S. Provisional Patent Application Ser. No. 60/640,391 filed Dec. 30, 2004 to inventors Torossian et al., titled CLOCK SIMULATION SYSTEM AND METHOD. The contents of such U.S. Provisional Patent Application Ser. No. 60/640,391 are incorporated herein by reference.

BACKGROUND

The present invention relates to the simulation of complex circuit designs and, in particular, discloses a system and method for the efficient simulation of clocked circuits.

The continued increase in the complexity of electronic circuitry has lead to continued demands for simulators that can simulate, to a high degree of accuracy and at great speeds, the complex interactions going on within a complex circuit. Further, the circuits are growing more and more complex with "System On Chip" (SOC) designs now being implemented containing hundreds of millions of logic circuits. Thus, the need for extensive simulation of circuitry is becoming increasingly important.

Various methods are used for the simulation of complex electronic circuits. The circuit to be simulated is normally described in a top down manner using a hardware description language (HDL) such as VHDL or Verilog. VHDL is described, for example, in IEEE Computer Society "IEEE Standard VHDL Language Reference Manual" New York, USA, June 1994, and Verilog is described, for example, in IEEE Computer Society, "IEEE Standard Hardware Description Language Based on the Verilog Hardware Description Language, New York, USA, 1996. These are commonly referred to as synthesis based approaches as the same circuit description may also be used in the generation of the physical circuit layout. As circuit complexity continues to increase, there is a trend to move away from these, synthesis based, approaches to ones using higher level hardware descriptions usually based on languages such as behavioral VHDL, Verilog with behavioral extensions, C and C++. An example of such a high-level simulation language is SystemC which uses C++ as a system description language. For more on SystemC, see, for example, www.systemc.org.

Once the circuit to be simulated is described in one of the above languages, simulators are available for extensively simulating the operation of the hardware device. For example, standard C++ compilers together with System C libraries can be used to simulate SystemC coded models. Complex circuits are often constructed using a high level languages such as Verilog, SystemC, VHDL or the like and extensively simulated using cycle accurate simulators to verify operation. Subsequently, after satisfactory verification, the model, if coded using a synthesizable HDL may be directly synthesized into lower level circuit designs. The model is extremely useful in allowing verification of the design and target software to proceed long before and even after the design has been implemented.

FIG. 1A shows an exemplary operating environment for operating a simulator. The simulator is run on a processing system, shown as host computer 101. The processing system 101 includes at least one processor 104, a memory subsystem 102, a display subsystem 105, a keyboard 107, a pointing and selecting device such as a mouse or another input device, all such input devices collectively shown as 110, local storage 106, and a network interface (NIC) 108 coupling the processor system to the network. The elements of the processing system are coupled via a bus subsystem 109 that is shown for the sake of simplicity as a single bus. The processing system (host computer 101) may include more or fewer components as is known. A simulator in the form of software 103 is used to simulate hardware and in one embodiment, also to simulate one or more processors running user software. The simulator is typically provided as a set of computer readable code segments to instruct the processor or processors of host 101 to implement a method of simulating. For the sake of simplicity, the simulator 103 is shown in the memory subsystem 102. Those skilled in the art will understand that at any time, most of the simulator is carried in the storage subsystem 106 or other carrier media, and not all of the simulator code will be present in the memory 102 at the same time.

While an arrangement such as shown in FIG. 1A is in general prior art, when one or more aspects of the invention are included in the simulator 103, FIG. 1A is not prior art.

FIG. 1B shows in functional form a simulation system that is of a structure known in the art. The simulation system includes a hardware simulator 111 that operates on a hardware model 112 of the circuit to be simulated, and that includes an event scheduler 113. In the shown implementation, the simulator operates in a co-simulation environment with other simulators 114, some of which, for example, simulate a processor running a user program. The event scheduler maintains a data structure 115 containing at least a main, time-ordered, time-scheduled event queue. The data structure 115 is shown in exemplary form as contained in the scheduler 113, but can be a separate structure. The scheduler places events that are in the future in the main time-ordered time-scheduled event queue in structure 115. For example, any change that is known to occur at a future simulation time is placed as an event for that future simulation time in the main event queue. The main queue is ordered in time. Other queues, e.g., for events that are to be processed at the present simulation time as a result of processing one or more events, also are included in the structure 115.

With a structure such as shown in FIG. 1B, each and every time event in the future is placed in the main queue in structure 115, and processed at the appropriate time. The inventors have found that this sometimes leads to a lot of processing, especially with repetitive signals such as clocks. There is a need in the art to speed up simulation so as to aid in the effective creation of more and more complex circuitry. For example, there recently have been developed "co-simulator" systems that abstract core components of a hardware design such as a microprocessor core device, while accurately simulating digital circuitry coupled to the code device. Examples of co-simulator systems are described in U.S. Pat. No. 6,263, 302 to Hellestrand et al. Such co-simulator systems are able to achieve substantial speedups in the overall simulation time. There still however, is a need to further speed up the simulation of digital circuits.

Example simulation systems include those described in U.S. Pat. No. 6,751,583 to Clarke et al., U.S. Pat. No. 6,263, 302 to Hellestrand et al., U.S. Patent Application Publication No. 2002/0083420 to Zammit et al., U.S. Patent Application Publication No. 2004/0088150 to Gay, and U.S. Patent Application Publication No. 2004/0111247 to Berevoescu et al.

A common feature of modern digital circuits is the presence of clocking circuits and clock signals ("Clocks). Some such clocking arrangements may be complex. The clock signals typically serve to synchronize activity within the various subsystems within a digital circuit design.

When simulating such a circuit, a model of the circuit is built, e.g., in a hardware description language. It is desired in such a model to provide for such clock signals to be stopped and re-started, and to otherwise be modified so as to change the frequency or phase or both frequency and phase of their repetitive behavior.

In order to accurately model such clock signals, existing hardware simulators model these clock signals as logic signals, e.g., as logic nets of type wire. A hardware simulator such as simulator 111 typically effect a change of state in a logic signal by scheduling an event in a time-scheduled event queue such as the main time-ordered event queue in data structure 115. Thus, in existing simulators, each significant transition of the clock signal is scheduled as an event in 115, regardless of whether or not events that affect the circuit, e.g., that cause significant changes in the circuit occur as a consequence of such a clock signal transition.

Scheduling events in a time-scheduled event queue and processing them is time consuming. Consider for example, the hardware simulator 111 of FIG. 1B. Suppose events are scheduled by the scheduler 113 by placing such events to be processed in the future into the time-ordered event queue. The hardware simulator 111 advance time to the next event time in the main queue, determined by the scheduler 113, and at a current event time, processes all the events in the time-scheduled event queue(s) 115 which have been scheduled to occur at the current event time. These events are processed in some arbitrary order. The events themselves may cause further events to be scheduled to occur at the current event time and/or at some future time. In a typical simulator 111, those events that are scheduled to occur at the current event time are typically put on to another queue in data structure 115, called a "delta" queue. Furthermore, the hardware model 112 being simulated may have a change of state at that simulation time. Each potential change of state is placed on an update queue in data structure 115, and the potential changes of state are propagated and resolved. Such changes of state to the model 112 being simulated are propagated prior to processing of the delta queue in 115. Some of the updates may lead to new events needing to be scheduled, including events that are scheduled to occur at the present time. Those new present time events also are placed in the delta queue in structure 115. Those events that are generated for processing at a future time are placed by the scheduler into the main event queue. Once all changes are propagated, events in the delta queue are processed. Such processing of the events on the delta queue may give rise to more events that are scheduled to occur at the current event time, and/or in the future. Events for the present time are placed on a second delta queue of events in structure 115, and so on. At the end of the processing of the first delta queue, changes of state to the model being simulated are propagated. Now events in the next delta queue are processed, and so forth. Changes of state are propagated only between the processing of these delta queues and after the final delta queue is processed until there are no more delta queues. Once all the delta queues have been processed for the current event time, the scheduler moves time to the next scheduled event in time according to the main time-scheduled event queue in structure 115.

Those in the art will recognize that such processing is time consuming.

Typical existing hardware simulators such as shown in FIG. 1B do not distinguished between clock signals that are predictable, and other logic signals. Furthermore, typical existing hardware simulators have not provided a mechanism to accurately model transitions of these clock signals other than as standard logic signals.

The need for dealing with clock signals other than as ordinary logic signals is best illustrated by example.

FIG. 3 shows an exemplary timer circuit that is used to explain the inconvenience of simulating clock signals as logic signals. The exemplary circuit including a four-tick timer circuit 333, a clock gate circuit 332 and a clock generator circuit 331. The clock generator produces a variable clock signal as an input to the clock gate circuit 332 that gates the input clock and provides an output clock to a clock input of the four-tick timer circuit 333. The four-tick timer circuit 333 counts significant clock edges (called ticks herein) at its clock input and, after a predetermined number of four clock edges, outputs a signal 334.

FIG. 4 illustrates a series of logic timing diagrams 441, 442, 443, and 444 describing the clock generator output, and operation of the clock gate circuit for the variable clock input signal denoted and connected to the clock generator output. For the purpose of illustration, assume logic ON (logical 1) is high and OFF (logical 0) is low. Timing diagram 441 shows the passage of hardware simulation time for a range of time in simulation time units. The clock generator 331 generates a clock signal denoted Clock of significant edges that start at periodicity of 10 time units. A significant edge of a repetitive clock signal is called a tick herein, and the time between repetitive periodic ticks is called the period herein. After time 70, the clock period of Clock changes to 30 time units, with the first tick (significant clock edge) at time 90 time units. Note that for illustrative purposes, the 0 to 1 edges are considered the significant edges—the ticks—of the clock signal Clock. In between the clock edges, the clock changes to 0 as indicated by dotted lines in timing diagram 442 that shows the clock generator output denoted Clock, equal to the input of circuit 332, denoted Clock in. Timing diagram 443 illustrates the clock enable input signal to the clock gate circuit 332, denoted Clock enable. Timing diagram, 444 illustrates the clock output signal from the clock gate 332, denoted Clock out. Note that transitions are clocked, such that the 1 to 0 transition of the Clock enable signal (diagram 443) occurs after the clock edge of Clock in at time 50, so that the Clock in signal at time 50 does appear at the Clock out output at this time 50, while the 0 to 1 transition of the clock enable signal (443) occurs after the clock edge at time 60, so that the Clock in signal at time 60 does not appear at the Clock out output at this time 60.

To simulate this behavior, a prior-art event-based simulator such as shown in FIG. 1B would schedule events in the main time-scheduled event queue in structure 115 at each of the clock edges at simulation times 230, 40, 50, 60, 70, 90 and 120. The Clock signal returning to 0 would also be scheduled in the time-scheduled event queue in 115. In this example, the return occurs two simulation units after the rising edge. The Clock enable signal would cause events to be scheduled at times 50 and 60 in the time-scheduled event queue in 115. Therefore, many events would be scheduled in the main queue even for this relatively simple circuit. It would be desirable to be able to define the clock signals Clock in in an alternate way to a logic signal so that events need not be scheduled in the time-scheduled event queue(s) 115 at all clock times. The inventors have noted that these clock signals Clock in and Clock out are predicable given the hardware model and the attributes of the clock, and in particular that each is "incrementally predictable" in that given the present state, and such attributes as the period and phase of the clock, and whether the clock is enabled or stopped, the next clock edge that can cause an effect is predictable.

FIG. 5 shows an exemplary set of timing diagrams 551, 552, 553, 554 and 555 that describe the operation of the four-tick timer circuit 333 for this example, with the input clock of circuit 333, denoted Timer clock and obtained directly from the output clock of the timer gate circuit 332 denoted Clock out. The timing scale 551 illustrates the passage of hardware simulation time. The timing diagram 552 illustrates the reset input signal to the four-tick timer circuit 333 denoted Timer reset, and this Timer reset signal is used to start the timer 333. The timing diagram 553 illustrates the output Clock out from the clock gate circuit 332, and is used as the input clock Timer clock to the four-tick timer circuit 333. Timing diagram 553 is identical to timing diagram 444 of FIG. 4. The number sequence 554 shows the count of the four-tick timer circuit and is only shown here to explain the internal operation of the timer 333. Timing diagram 555 illustrates the output signal—denoted Timer out—from the four-tick timer 333 for the described signals.

Notice that at time 40, the reset signal (diagram 552) is still asserted (=1) because a change, e.g., the change to 0 occurs as a result of a clock edge in Timer clock shown in timing diagram 553. Therefore, the internal count (554) is still 0 after time 40, and only increments to 1 after the significant edge of the clock signal Timer clock at time 50. The count becomes 4 after the clock edge of Timer clock at time 120, at which time the Timer out output jumps to 1.

The operation described in FIG. 5 is simulated in a prior art event-driven hardware simulator such as that shown in FIG. 1B by a set of logic signal events scheduled by scheduler 113 in the main time-scheduled queue in structure 115 evidencing the transitions from low to high (0 to 1) and high to low (1 to 0) of each of the above signals including the clock signals. However, the Clock in signal that has relatively many transitions, and therefore that results in relatively many scheduled events in queue that need to be processed in a prior art simulator, is a clock signal that is derived from another clock signal, that is input to the clock gate 332. The inventors have noted that the clock transitions are therefore predicable, in particular, incrementally predicable. It would be desirable to model such incrementally predicable clock signals in a manner other than logic events so that fewer events need to be scheduled.

Furthermore, the increase in the internal count shown in 554 is, in the case of a prior art event-driven hardware simulator such as that of FIG. 1B, the result of processing of scheduled events in structure 115, e.g., the Timer clock signal edges, which themselves are the result of events scheduled in simulating the Clock gate 332. The inventors have noticed that the count is of predictable clock signals. It is desirable to schedule events based on counts of clock edges without needing to process each clock edge if no significant events other than increase in count occur. Typical prior-art hardware simulators such as shown in FIG. 1B do not provide such events to be scheduled with respect to transition counts of accurately modeled transitions on such repetitive clock signals.

Thus there is a need in the art for a method and for a hardware simulator, and for a language that includes instructions for the simulator to enable clock signals to be modeled other than as logic signals, so as to reduce the amount of traditional event scheduling, so as to reduce the amount of processing needed to simulate circuits involving such clocks.

SUMMARY

An aspect of the present invention provides for a system and method for designing and accurately simulating models of complex circuits containing one or more clock signals.

A clock signal is a signal having one or more attributes that provide for determining the time of the next event. One example of a clock signal is a repetitive signal, and the attributes of such a signal include at least one of the set consisting of the current value of the clock period, the number of significant edges—the transition number—at a reference point, the time corresponding to the reference point, an indication whether the clock is stopped or not, and the time from the present time to the next significant edge (called a tick). Thus a tick as used herein is a significant edge of a repetitive clock, e.g., a rising or falling edge.

Traditional simulators schedule time-scheduled events: events whose occurrence time is defined by reference to the simulation time.

One aspect of the invention provides for clock-scheduled events. These are events whose occurrence time is defined relative to one or more attributes of at least one particular clock signal.

A hardware simulator is constructed as software for instructing a processor of a processing system to simulate a circuit. The hardware simulator includes a hardware model representing the circuit, and a scheduler. The hardware simulator further includes a time-scheduled event data structure for the scheduler to schedule time-scheduled events, and a clock-scheduled event data structure for the scheduler to schedule clock-scheduled events. The hardware simulator further includes a current event data structure for events being processed at the current simulation time, and a pending event data structure for events scheduled for processing at the current simulation time while events from the current event data structure are processed by the hardware processor.

By including such structures, each and every transition of any clock signal need not be scheduled in the time-scheduled event data structure.

An aspect of the invention is a method of simulating a clocked digital circuit. The method includes providing a set of primitives accessible from a hardware description language, the primitives used with a hardware description language definition of the circuit for simulating clocked events occurring at a simulation time in the future defined according to predetermined values for one or more attributes of a clock signal; and simulating the clocked circuit using the primitives, such that each transition of the clock signal does not need to be scheduled. In some embodiments, the predetermined values include a predetermined number of clock ticks into the future in simulation time. Also, in some embodiments, simulating the clocked circuit using the primitives includes the registering of the used primitives, the registering providing handles for use in simulation time. Also, in some embodiments, at least one of the primitives includes changing the period of the clock signal.

Also, one aspect of the invention is a method of simulating a digital circuit operating with one or more clock signals, a clock signal being a signal having one or more attributes that provide for determining the time of the next clock signal driven event. The method includes forming a hardware model representing the circuit. The method further includes scheduling one or more time-scheduled events according to the model, the scheduling in a time-scheduled event data structure, a time-scheduled event being an event whose occurrence time in a simulation time frame is defined by reference to a simulation time. The method further includes scheduling one or more clock-scheduled events according to the model, a clock-scheduled event being an event whose occurrence time is defined relative to one or more attributes of at least one clock signal in the circuit, predicting the occurrence time of the clock-scheduled events; and, at any particular simulation time, processing the time-scheduled events for the particular simulation time and clock-scheduled events predicted to occur at the particular simulation time, such that clocked-scheduled events are distinguishable from time-scheduled events, and such that each and every transition of any clock signal need not be scheduled in the time-scheduled event data structure.

Another aspect of the invention is a carrier medium carrying computer readable code, e.g., software, to cause a processor of a processing system to implement a hardware simulator. The simulator includes a hardware model constructed from a description of a digital circuit, the digital circuit including a clock signal, a time-scheduled event data structure for scheduling time-scheduled events, a time-scheduled event being an event whose occurrence time in a simulation time frame is defined by reference to a simulation time, a clock-scheduled event data structure for scheduling clock-scheduled events, a clock-scheduled event being an event whose occurrence time is defined relative to one or more attributes of a referenced clock signal, and an event scheduler arranged to schedule one or more time-scheduled events in the time-scheduled event data structure according to the model, and to schedule one or more clock-scheduled events according to the model. The hardware simulator is arranged, when simulating the hardware model, to predict the simulation time of the clock-scheduled events and at any particular simulation time, process the time-scheduled events for the particular simulation time and clock-scheduled events predicted to occur at the particular simulation time, such that clocked-scheduled events are distinguishable from time-scheduled events, and such that each and every transition of any clock signal need not be scheduled in the time-scheduled event data structure.

One aspect of the invention includes a method of simulating a digital circuit, the circuit including one or more elements and at least one clock signal, each clock signal having one or more attributes, including the clock signal's period in units of a simulation-time. The method includes maintaining a data structure for time-scheduled events, each time-scheduled event scheduled to occur at a particular simulation-time; and maintaining a data structure for clock-scheduled events, each clock-scheduled event corresponding to a particular clock signal and scheduled to occur at a time that can be determined from one or more attributes of the clock signal, such that clocked-scheduled events are distinguishable from time-scheduled events, and such that each and every transition of any clock signal need not be scheduled in the time-scheduled event data structure. In some embodiments of the method, the clock signal attributes include at least one of the set consisting of the value of the clock period at the current simulation time, an indication of whether or not the clock signal is stopped, an indication of the number of ticks of the clock signal since a reference point in time, the simulation-time corresponding to the reference point, and the simulation-time increment from the present simulation-time to the next tick of the clock signal, a tick being a significant edge of the clock signal.

Another aspect of the invention is a carrier medium carrying computer readable code to instruct a processor to implement a method of simulating a digital circuit. The method includes accepting code generated from a hardware model of a digital circuit defined in a language, the digital circuit operating according to a clock signal having one or more attributes, the attributes including at least one of the set consisting of the value of the clock period at the current simulation time, an indication of whether or not the clock signal is stopped, an indication of the number of ticks of the clock signal since a reference point in time, the simulation-time corresponding to the reference point, and the simulation-time increment from the present simulation-time to the next tick of the clock signal, a tick being a significant edge of the clock signal. The method further includes running a hardware simulator operating according to the hardware model, the simulator including a scheduler arranged to be able to (a) schedule a clock-scheduled event at a first simulation-time in the future determinable from one or more provided parameters of the clock signal; and (b) schedule a time-scheduled event at a second simulation-time in the future defined by a provided or determined value of simulation time or simulation time delay. The simulator is arranged to process the scheduled events. The method is such that clocked-scheduled events are distinguishable from time-scheduled events, and such that each and every transition of any clock signal need not be scheduled in the time-scheduled event data structure.

One aspect of the invention is a method of simulating a digital circuit. The method includes providing a simulated clock signal simulating a digital clock signal having periodic significant transitions, and having one or more attributes. The method further includes scheduling one or more clock-scheduled events to occur according to the circuit and one or more values of corresponding attributes of the clock signal in the circuit, a clock-scheduled event being an event whose occurrence time is defined relative to the one or more attributes of the clock signal in the circuit. The method further includes, for a scheduled clock-based event, determining the next simulation time in the future for the clock-scheduled event to occur from one or more provided or determined properties of the clock signal, and scheduling the event to occur at the determined simulation time. In some embodiments of the method, one attribute of the clock signal is the clock period, and the method further includes altering the period of the simulated clock signal; and, upon the alteration of the clock period, updating determined next simulation time for the event to occur, and rescheduling the event to occur at the updated determined time. Also, in some embodiment, the digital circuit includes a timer circuit driven by the clock signal, and wherein one of the clock-scheduled events is described according to a count of ticks of the clock signal.

An aspect of the invention is a means for simulating a digital circuit operating with one or more clock signals, a clock signal being a signal having one or more attributes that provide for determining the time of the next clock signal driven event. The simulating means includes means for accepting a hardware model representing the circuit, means for scheduling one or more time-scheduled events according to the model, the scheduling in a time-scheduled event data structure, a time-scheduled event being an event whose occurrence time in a simulation time frame is defined by reference to a simulation time; and means for scheduling one or more clock-scheduled events according to the model, a clock-scheduled event being an event whose occurrence time is defined relative to one or more attributes of at least one clock signal in the circuit. The simulating means further includes means for predicting the occurrence time of the clock-scheduled events; and means for processing events, the processing means at any particular simulation time processing the time-scheduled events for the particular simulation time and clock-scheduled events predicted to occur at the particular simulation time, such that clocked-scheduled events are distinguishable from time-scheduled events, and such that each and every transition of any clock signal need not be scheduled in the time-scheduled event data structure.

DETAILS DESCRIPTION OF PREFERRED AND OTHER EMBODIMENTS

Figure 1A:
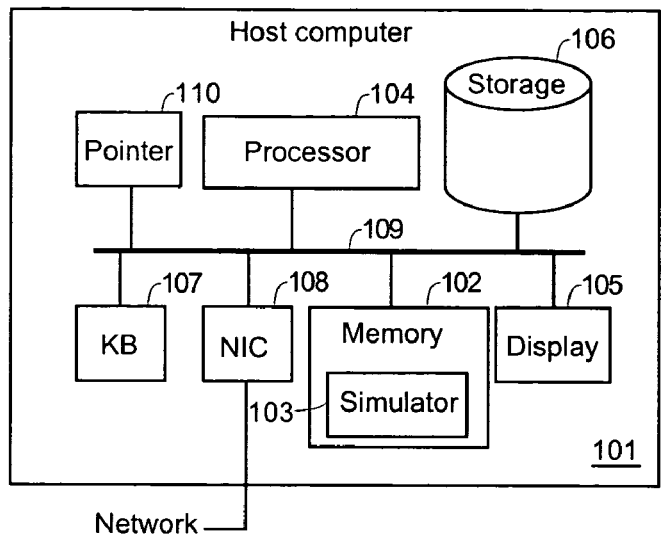
FIG. 1A shows an exemplary operating environment for operating a simulator. The simulator is run on a processing system, shown as a host computer. While a system such as shown in FIG. 1A is prior art, one in which the simulator includes one or more aspects of the present invention is not prior art.

The method, models, and system embodiments of the invention include components that operate on a host computer system as illustrated in FIG. 1A. The system of FIG. 1A is described above in the Background section. While a system such as shown in FIG. 1A is prior art, one in which the simulator includes one or more aspects of the present invention is not prior art. The host computer system may be a single computer, for example, a computer workstation. Such workstations are readily available, and may operate under any operating system (OS) such as any variants of the UNIX operating system (including LINUX™.), or any variants of Microsoft Windows™. (e.g., Windows NT, Windows 98, Windows 2000 or Windows XP from Microsoft Corporation, Redmond, Wash.), or the Mac OS (Apple Computer, Cupertino, Calif.). Some embodiments operate under a computer network that includes a plurality of host processors interconnected as a network, while other embodiments run on a multiprocessor computer that includes a plurality of host processors. The term "host computer system" thus means a computer system with a single host processor, or a plurality of interconnected host processors that may be interconnected as a network, or a multiprocessor computer.

Figure 1B:
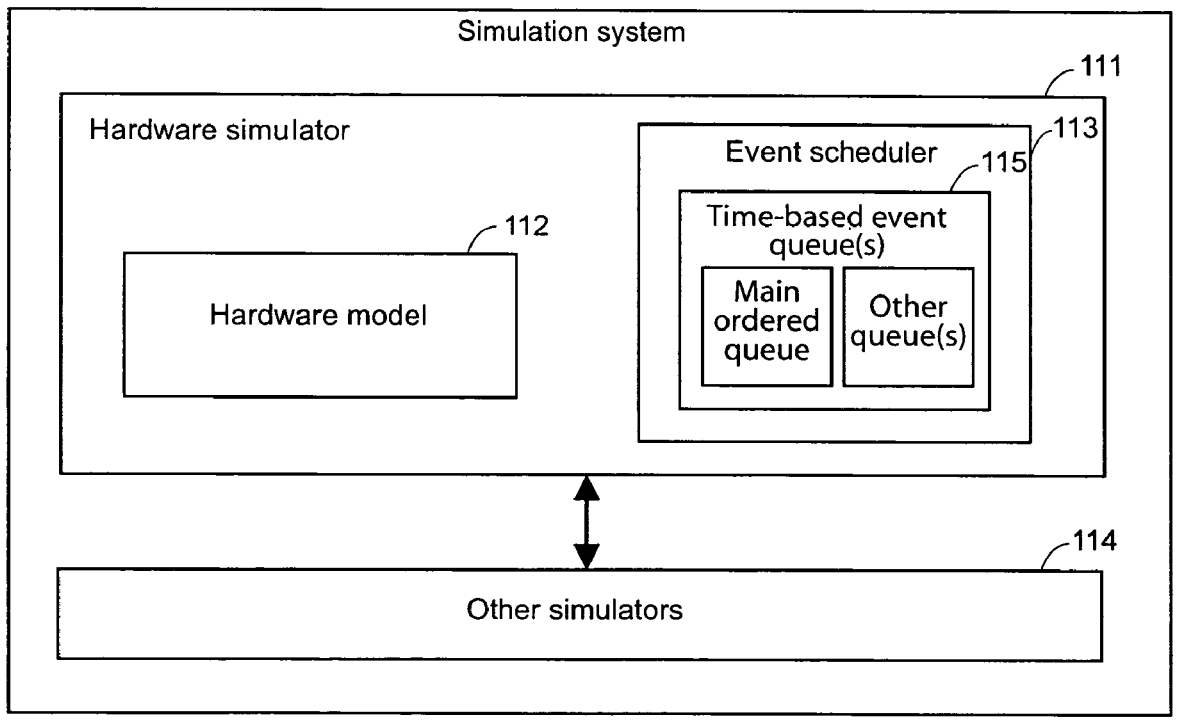
FIG. 1B shows a typical prior-art hardware simulator with an event scheduler, simulating a hardware model, operating in a co-simulation environment with other simulators.
Figure 2A:
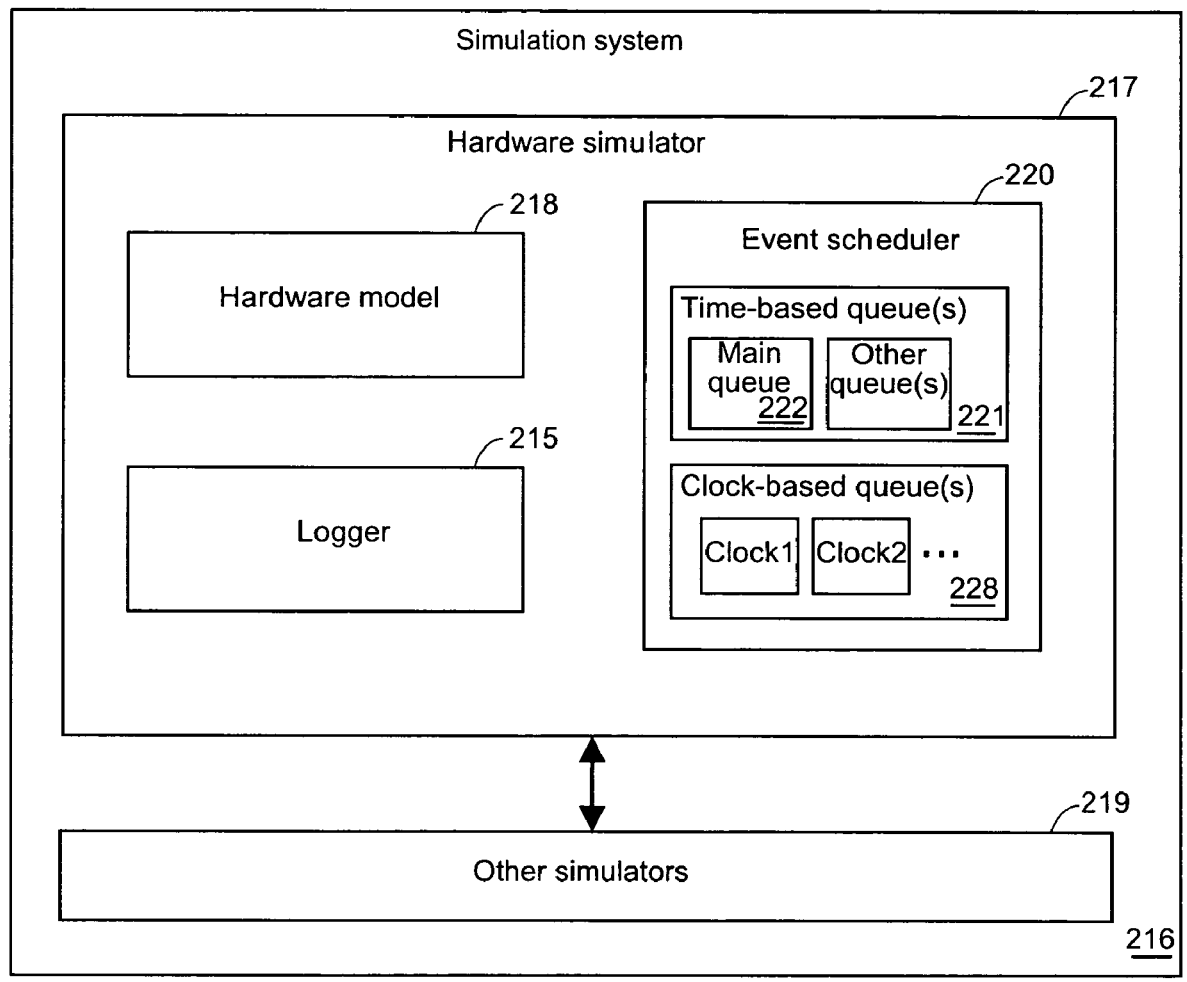
FIG. 2A shows an embodiment of a hardware simulator with an event scheduler that includes aspects of the present invention, simulating a hardware model, operating in a co-simulation environment with other simulators.

FIG. 2A shows one embodiment of a simulation system that can, for example, operate on a host computer such as the processing system 101 shown in FIG. 1A. The simulation system includes an embodiment of a hardware simulator 217 that operates in a manner that includes features of the present invention, and that operates methods that include aspects of the present invention. The hardware simulator 217 operates on the host computer system and simulates a described hardware model 218. The simulation system of FIG. 2A is an extension of the prior-art simulator of FIG. 1B in that it includes many similar components. The hardware simulator 217 includes an event scheduler 220. The event scheduler 220 includes aspects of the present invention not present in the prior-art event scheduler 113 of FIG. 1B.

Figure 2B:
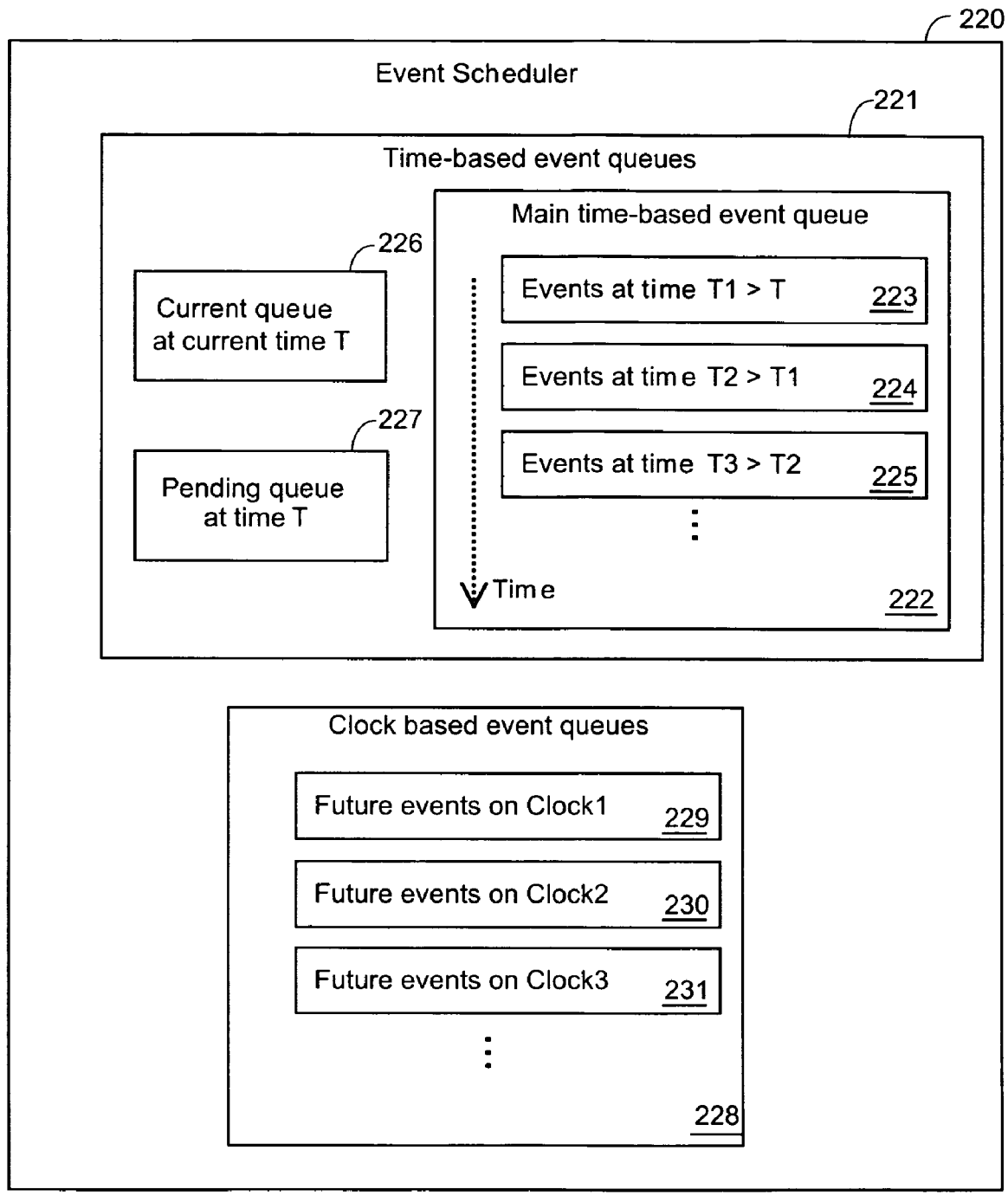
FIG. 2B shows one embodiment of an event scheduler, with a typical time-scheduled event queue, current event queue and pending event queue as well as additional clock specific event queues which facilitate re-scheduling of clock-scheduled events on changes to clock signal parameters.

FIG. 2B shows one embodiment of the event scheduler 220, with a set 221 of time-scheduled event queues as well as additional clock-specific event queues that facilitate scheduling of clock signal based events, and re-scheduling of clock-scheduled events on changes of clock signal attributes.

In one embodiment, the hardware simulator 217 operates in a hardware description language, in particular Verilog, and so the description of the target digital circuitry 218 is provided by a user in the form of Verilog code and processed by hardware simulator tools to prepare the hardware model 218.

In the description herein, some of the terminology is as understood in the Verilog language. For example, the term "net" is used here as in Verilog to indicate a scalar (single-bit) or vector (multi-bit) wire that connects elements. Nets may be of other net types as would be understood by those skilled in the art. For example, other than wire nets, net types include tri nets that like wire nets, connect elements. There further are wired nets that are used to model wired logic configurations and that resolve the conflicts that result when multiple drivers drive the same net.

One embodiment includes extensions to the Verilog Programming Language syntax or to the Verilog Programmable Logic Interface (PLI) or to both, so as to include the capability for clock-scheduled scheduling of events. These extensions provide for the simulator to distinguish between clock signals (in general "clock nets") and standard logic level signals (in general, "standard logic level nets"). These extensions would permit events to be scheduled ahead in time with respect to forthcoming significant transitions, i.e., forthcoming ticks—on particular clock signals.

A clock signal is a signal having one or more attributes that provide for determining the time of the next event, e.g., such that at any time, a scheduler can predict the next event from knowledge of the hardware model, the present state of logic nets in the model, and one or more attributes of the clock net. We call the property that the next event is so predicable the property of being "incrementally predicable." One example of a clock signal is a repetitive signal, and the attributes of such a signal include at least one of the set consisting of the current value of the clock period, the number of significant edges—the transition number—at a reference point, the time corresponding to the reference point, and the time from the present time to the next significant edge. Such a significant edge is called a tick herein; thus a "tick" as used herein means a significant edge of a repetitive clock, e.g., a rising or falling edge.

While the Verilog language is assumed in one embodiment, embodiments of the invention can also work with other hardware description languages such as VHDL and SystemC, and with hardware descriptions in terms of libraries, or libraries and classes written in a higher-level general-purpose computer language such as C, or C++. Thus, the invention does not depend on the particular hardware models used in the hardware simulator 217, or on the language or languages used to describe such models. A hardware model, for example, may be described by the combination of various hardware description languages, including for example, C or C++ language functions, and compiled into a common code which the hardware simulator can operate upon.

One aspect of such common code provides for the simulator to distinguish between logic level signals and clock signals and includes functional information with respect to the model, such information describing its operation both in terms of units of simulation time and in terms of significant transitions, i.e., ticks of clock signals. Both prior art simulators and the simulator 217 described herein can schedule time-scheduled events, defined herein as events whose occurrence time is defined by reference to the simulation time. One aspect of the invention also provides for clock-scheduled events. These are events whose occurrence time is defined relative to one or more attributes of at least one particular clock signal.

One embodiment of the hardware simulator 217 is constructed as software for instructing a processor of a processing system such as host processor 101 to simulate a circuit. The hardware simulator 217 includes the hardware model 218 representing the circuit, and the scheduler 220. The event scheduler 220 of the hardware simulator 217 maintains one or more data structures for scheduling events to be processed as shown in FIGS. 2A and 2B. In one embodiment, the hardware simulator 217 includes a time-scheduled event data structure 222 for the scheduler 220 to schedule time-scheduled events, and a clock-scheduled event data structure 228 for the scheduler to schedule clock-scheduled events. The hardware simulator further includes a current-time event data structure 226 for events being processed at the current simulation time, denoted T, and a pending event data structure 227 for events scheduled for processing at the current simulation time T while events from the current event data structure 226 are processed by the hardware processor. The events in the pending event data structure 227 are processed after the events at the current-time event data structure 226 are processed. The time-scheduled event data structure 222, current event data structure 226, and pending event data structure 227 are in one embodiment maintained in a time-scheduled event data structure 221.

In one embodiment, each of the structures in data structure 221 is a queue, such that data structure 221 comprises a set of time-scheduled event queues. Thus the event scheduler 220 of the hardware simulator 217 maintains a main time-scheduled event-queue 222, a current-time event queue 226, and a pending event queue 227.

Note that while the structure of the time-scheduled event queues 221 is similar to that of structure 115 in FIG. 1B, the particulars of the queues, however, may be different than for a prior art simulator.

By including such structures, each and every transition of any clock signal need not be scheduled in the time-scheduled event data structure.

Operating the simulation system includes:
1) A user coding the model e.g., in Verilog or another HDL, that includes extensions such that the HDL includes the concept of a clock net and that cause the scheduling of clock-scheduled events to occur according to one or more attributes of a particular clock, on, in inclusion in the code of tasks and/or functions as defined herein and as needed to code the scheduling of clock-scheduled events to occur according to one or more attributes of a particular clock. The use of tasks and/or functions is assumed.
2) Building the hardware model 218. This includes compiling the coded model into binary code.
3) Assembling. This includes providing configuration information to interconnect all the individual model elements, providing initialization conditions, and so forth.
4) Elaboration. This includes starting the simulation system so that the simulator 217 forms all the data structures it needs to operate.
5) Initialization to generate instances of each model used. In the case that callback functions are used (see below), one embodiment includes in initialization, registering the callback functions such that the callback functions can be scheduled to be called, e.g., at a later point in time (time-scheduled), or according to at least one parameter of a clock (clock-scheduled), or according to a change of a clock. Registration returns a handle, e.g., an identifier, for the simulator 217 to use for scheduling.

Once these steps are undertaken, the simulator can be started to simulate the circuit.

Note that alternate embodiments are possible without requiring that callback functions first be registered. By registering such functions, all the data structures required for later scheduling the callback function are built in advance. Note also that registering a function is sometimes called "installing" a function by those in the art.

Registering a function includes:
1) Providing the simulation system with a pointer to the function.
2) Providing the simulation system with a pointer to the data to be passed in calling the function.
3) In the case of a clock-net based scheduling, providing the simulation system with a handle for the clock signal, and in the in the case for logic-net based scheduling, providing the handle of the logic net or signal.

The return of the registering process is a handle for use in scheduling according to the clock net or logic net or time, as appropriate.

After registering, the common code for operating the simulator simulating the particular circuit is available to be run on the simulation system on the host computer system.

The hardware simulator 217 when running the hardware model 218, causes the scheduler 220 to place incoming future events such as changes in logic nets and other events on the main time-scheduled queue 222. The scheduler 220 sorts these events to maintain the events in the main time-scheduled queue 222 ordered according to the simulation time. Denoting the present time by T, FIG. 2B shows one or more events 223 at a first future time denoted T1, T1>T, one or more events 224 at a second future time denoted T2, T2>T1, one or more events 225 at a third future time denoted T3, T3>T2, and so forth. The scheduler 220 also keeps track of the current simulation time T, and sends events to be processed at the current simulation time T to the hardware simulator 217 based on the current simulation time T.

In one embodiment, the hardware simulator 217 includes a logging mechanism (a logger) 215 that provides logging of results by step, by cycle, by triggered events, by any combination thereof, and so forth, for review by a user via a user interface that operates as part of, or separately from the hardware simulator 217. One embodiment provides for review at run time, and also for review after the simulation has run to its conclusion. In one embodiment, the logging mechanism 215 can be instructed upon specified events to halt the simulation and to post the results of the simulation immediately. The logging mechanism 215 can also be instructed to pass the results to another application. As an example, in one version, an operator can request an "on-occurrence" event triggered by some event, and the event scheduler 220—and any other simulators or utilities operating according to the scheduler 220—are arranged to stop when this "on-occurrence" event occurs.

One aspect of the invention is that the hardware simulator 217 also schedules clock-scheduled events as well as time-scheduled events. In one embodiment, the clock-scheduled events are scheduled on a set of clock-scheduled event queues 228 that in one version—that shown in FIG. 2B—are contained within the event scheduler 220 itself, and in another version are maintained separately. In another embodiment, clocked events are maintained in the same data structure as the queues 222, 226, and 227 of time-scheduled events.

For example, when simulation time is advanced to the current simulation time T, the events in the queue 222 that are for the current time T form the events of the current event queue 226. The hardware simulator 217 running the hardware model 218 receives current scheduled events at the current simulation time from this current event queue 226. The hardware simulator 217 within the context of the hardware model 218 then evaluates each of these events. The simulator 217 updates the stored descriptions of the components of model 218 with changes that are to be propagated through the model 218. In addition, the evaluation of the events from the event scheduler's current event queue 226 may also generate one or more events to be scheduled to take place at the current simulation time T, and/or one or more events to be scheduled to take place at some future simulation time. The hardware simulator 217 communicates these addition current-time and future-time events to the event scheduler. The event scheduler 220 schedules the events for the current time by placing them on its pending event queue 227. Events that are scheduled for the future are scheduled in future simulation time by either referring to simulation time delays from current simulation time, or, according to one aspect of the invention, by referring to transition count delays (delays expressed as a number of ticks) with respect to a particular clock signal. The event scheduler 220 schedules future time-scheduled events by placing them on its time-scheduled event queue 222. According to one aspect of the invention, the event scheduler schedules future clock-scheduled events by placing these future clock-scheduled events into one of the clock-scheduled event queues 228 for the respective clock signal. FIG. 2B shows in the clock-scheduled event queues 228 a first queue 229 of future clock-scheduled events on a first clock denoted Clock1, a second queue 230 of future clock-scheduled events on a second clock denoted Clock2, a third queue 231 of future clock-scheduled events on a third clock denoted Clock3, and so forth.

In one embodiment of the invention, if a particular clock signal is currently active, i.e. not stopped, the simulator calculates the time of the future clock-scheduled event and schedules the future clock-scheduled event on the time-scheduled event queue 222 for that calculated simulation time. If a particular clock signal is currently inactive or stopped, the future clock-scheduled event is only placed on one of the clock-scheduled event queues 228, and not placed onto the time-scheduled event queue 222. For the inactive clock, the turning on of the clock is itself an event, and when such an event is processed, i.e., the clock signal later becomes active, the calculated next clock-scheduled event is placed into the time-scheduled event queue 222.

Note that the inventors have found it simplifies programming to place clock-scheduled events onto the time-scheduled event queue 222 for processing as soon as the time of the next clock-scheduled event is calculated, such that all events to be processed in the future are processed from the one queue 222. In alternate embodiments, events that are calculated from clock-scheduled entries are processed at the calculated time without such events first being placed in the main time-scheduled event queue 222.

Continuing with the description of processing of the events for the current time T, the hardware simulator continues processing all the events received from the event scheduler's current event queue 226. The simulator resolves and propagates the changes effected by the events within the stored descriptions of the components throughout the model 218. So propagating changes typically generates additional current time events. These additional current time events are also scheduled via the event scheduler 220 onto the pending event queue 227. When the propagation of changes is completed, the event scheduler 220 then uses makes contents of the pending event queue 227 the contents of its current event queue 226, that such that the pending queue 227 is emptied. The events from what was the event scheduler 220's pending event queue now in its current event queue are called delta time events. The contents of the current event queue 226 are processed by the hardware simulator 217. This may lead to new events pending for the current time T, as well as events for the future. These pending events for the present time are placed in the pending event queue 227. Thus, after the contents of the current event queue 226 are processed and the results propagated, there may be a new set of events that are in the pending queue 227. These now form the events of the current event queue 226 to be processed at the current time T. Each set of such events that are found in the delta queue at the end of processing of a current event queue are on a different time delta from the original contents of the current event queue were in the time-scheduled event queue 222 when the current time was advanced. Thus, each such set of events from a version of the current event queue is processed separately, even though the sets of events occur at the same current simulation time T. The processing of each such set includes the hardware simulator evaluating events sent from the event scheduler's current event queue 226, propagating the model state changes through the model 218, and, if there are new events pending for the current time, future time, or as future clock-scheduled events, generating such current time events, future time events, future clock-scheduled events and for the queues 227, 222, and 228, as appropriate. The event scheduler again "replaces" its empty current event queue 226 from the pending event queue 227 resulting in an empty pending queue 227.

Eventually, after several iterations, the hardware simulator has an empty current event queue 226 and an empty pending queue 227. At this point, the event scheduler 220 advances the current simulation time to the next scheduled event time from its time-scheduled event queue 222. All events in the queue 222 that are pending at this new current simulation time form the event scheduler's current event queue 226 based on the new current simulation time. The event scheduler 220's treating these events as in the new current event queue includes removing from the corresponding clock-scheduled event queues 228 any of events at the current time that were in the time-scheduled event queue 222 and that are clock-scheduled events for the respective clock signal because such clock-scheduled events are no longer future clock-scheduled events and are now current clock-scheduled events.

Note that one aspect of the invention is that clock-scheduled events queue from the scheduler's time-scheduled event queue 222 are treated as the event scheduler's current event 226, and such events from the main event queue 222 cannot be scheduled on to the event scheduler's pending event queue 227, such that clock-scheduled events can never occur on a delta time queue. This provides advantages over many prior art simulators. Because delta queues contain events that are meant to be processed at the same current simulation time T, and because the processing of delta events does not commence until all the previously scheduled events for the present time have been processed, and the results propagated, race conditions might occur. By avoiding the processing of clock-scheduled events on a delta queue, one aspect of the present invention avoids such potential race conditions.

After the scheduled events for the new current simulation time T are "transferred" to the current event queue 226, the hardware simulator 217 receives and processes the current scheduled events for the current simulation time from the event scheduler's current event queue 226. The processing is then repeated for the new current time T. The time then further advances and processing continues until the simulation is complete.

Note that the above describes a single hardware simulator. In alternate embodiments, multiple simulation engines, and even multiple tightly coupled, e.g., the simulation time is the same across the schedulers, or loosely coupled schedulers, e.g., schedulers that operate asynchronously, may operate simultaneously with the hardware simulator 217 co-executing with other simulators 219 in a cooperative manner. The other simulators 219 can include processor simulators such as those described in U.S. Pat. No. 6,751,583.

In one embodiment, there is provided a methodology for providing for the hardware simulator high performance modeling of clocked digital circuits through the use of a particular clock net signaling structure.

With prior art event simulations, simulating a clocked circuit with a repetitive clock signal includes providing the simulation capability for simulating the rising and falling edge of the clock signal. Clocked digital circuits operate to the march of a clock with ticks of the clock providing for an overall time based reference. Hence, when, for example, simulating a timer operational after a predetermined number of clock periods, it is necessary to simulate each tick of the clock—indeed each clock edge, even the non-significant edges—and increment the timer for each significant edge until such time as say the timer reaches a preset value and activates a logic circuit. This is normally achieved by simulating the effects of a change in the clock edge on the timer circuit in question, with each clock edge being simulated in turn.

Thus, a traditional event-driven simulator such as that shown in FIG. 1B sets up a series of logic signal events for the transitions from low to high (0→1) and high to low (1→0) of each clock signal in the elements of a circuit being simulated. This involves scheduling a relatively large number of events in a data structure for time-scheduled events, some of which—in particular the clock signals—are actually predicable from attributes of the clock signal(s).

Aspects of the present invention provide substantial efficiency in the discrete event hardware simulation by making available a set of clock signal "primitives" that define the functionality and timing accuracy of clock signals without requiring each clock transition to be simulated as a logic-based event. For example, in the case of the exemplary circuit of FIG. 3, such clock signal "primitives" provide for the functionality and timing accuracy of the clock signals provided by the clock generator 331, the clock gate 332 and the four-tick timer 333 without the need to simulate each of the clock signal transitions of the clock signals as logic signal events.

Figure 3:
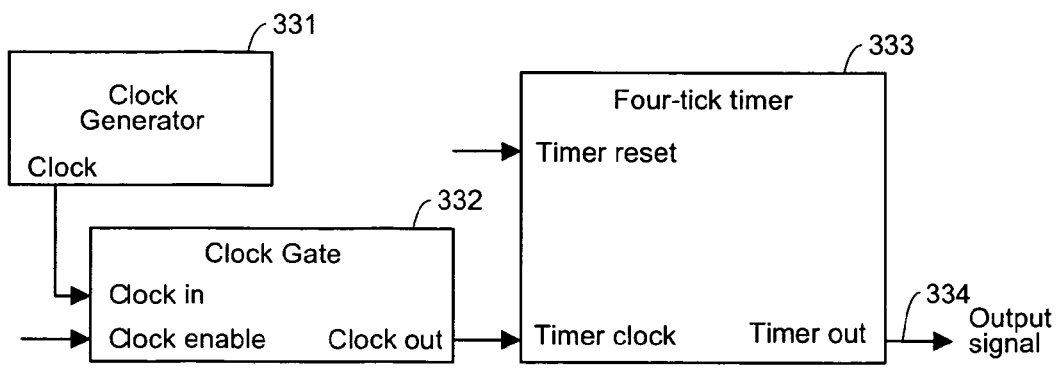
FIG. 3 shows an example timer circuit used to illustrate aspects of the invention. The timer circuit includes a four-tick timer circuit, a clock gate circuit and a clock generator circuit. The clock generator circuit produces a variable clock signal.

For cases wherein repetitive clock signals are used in a circuit being simulated to provide synchronization for the circuit elements, the provided primitives can be used in place of, or in a modified form of the logical circuit elements such as the clock generator 331, the clock gate 332 and four-tick timer 333 of FIG. 3, so as to eliminate the need to simulate, e.g., to schedule in time each of the clock signal events, e.g., each and all of the clock edge transitions.

Referring to FIGS. 2A and 2B, in one embodiment, the event scheduler 220 has the ability to schedule clocked events occurring into the future according to knowledge of the attributes of the clock signal, including its period, and further according to knowledge of how any element in the circuit modifies a clock signal and/or produces another clock signal, such that the need to simulate each clock transition is eliminated. This can provide a substantial gain in efficiency. For example, knowledge by the programmer setting up the model of the nature of each circuit element being modeled and such a circuit's effect on any clock signal, coupled with knowledge of any clock signals produced by any elements, allows such a programmer construct a model 1 such that the future event can be scheduled by scheduler 220 with reference to properties of the clock signal, e.g., in terms of clock ticks. This provides advantages over modeling clock transitions as logical events.

Suppose an event is so described and scheduled in a clock-scheduled event queue in structure 228 with reference to one or more attributes of a particular clock signal, e.g., in terms of clock ticks of a particular clock signal. When the hardware model is simulated, the hardware scheduler 220 predicts the actual simulation time of the event in the clock-scheduled event queue in structure 228 and inserts this clock-scheduled event into its time-scheduled event queue 222 in structure 221. The scheduler 220 also keeps track of this future event in 222 and 228 as being dependent upon the current state of the particular clock signal. Keeping track of the current state of a clock signal aspect provides for accurately modeling clock signals whose attributes change. For example, suppose the time for a clock-scheduled event is determined and the event is scheduled in the time-scheduled event queue in structure 222. The scheduler 220 is able to automatically re-schedule delays in terms of clock ticks when the particular clock signal's properties such as the clock signal's clock period are changed in an intervening period between the original scheduling of the clock-scheduled event and the occurrence of the event.

In one embodiment, there is provided a simulation system that allows for the concept of a "clock net" that is different from a regular signal net. A clock net structure stores for each clock net (clock signal) attributes associated with the clock signal, including a tick number at a reference point, the corresponding time of the tick reference point, i.e., the time the tick number is in reference to, and the current clock period value. Any time at least one attribute of the clock net is changed, the reference point time and tick count are updated, e.g., the reference point is moved in time and the tick count changed. The current clock period value indicates the number of simulation time units that lapse between subsequent ticks of the clock signal. The clock signal reference point's tick number and corresponding reference tick time are updated whenever the clock's period and/or position of next tick is/are changed. In one embodiment, the scheduler 220 predicts the simulation time of future clock ticks by:

1. determining the number of ticks to be counted beyond the clock's current reference point (in time),
2. multiplying this number by the clock signal's current clock period, and,
3. adding this result to the simulation time of the clock signal's current reference point.

For a particular clock signal, the event scheduler 220 is notified by the hardware simulator 117 during its signal propagation phase, of each occurrence of each change of the clock signal, and updates the clock net structure and any events that have been scheduled with reference to this clock signal. One aspect of the invention is that the event scheduler need not, and typically does not update the clock net structure only because time advances, even when such an advance moves time such that one or more ticks of the clock occur, e.g., moves time by more than a period. A set of primitives are provided for scheduling and predicting clock-scheduled events. These primitives interact directly with the hardware simulator's scheduler 220 to perform the various clock related functions.

Thus, the language for defining the hardware model includes primitives provided for defining the clock signal, and for scheduling clock-scheduled events according to one or more attributes of the clock signal. The language is typically an available hardware description language such as Verilog, VHDL, or SystemC, or derivatives thereof.

In the embodiments described in detail herein, the language includes a mechanism for calling functions, and the primitives include at least one function callable from the hardware description language using the language's calling mechanism.

In alternate embodiments, the primitives include at least one additional command for the hardware description language, such additional commands and the available hardware description language together defining an extended version of the hardware description language, e.g., an extended version of Verilog that provides for distinguishing clock-scheduled events and time-scheduled events.

In the embodiment described herein, a C-Language modeling environment includes the functions described herein below. These primitives described in detail herein are for tasks and for callback functions that are written in the C-language and that a user can use in building the model 218 to implement clock-scheduled event scheduling.

In the following function definitions, a distinction is made between a "task" and a "callback function." Each of these refers to a part of a model 218, e.g., a function that is coded in one example using the C-language or its derivates, e.g., C++. A task herein refers to a section of an actual model. When an instance of a model is set up during initialization, instances of any tasks in the model are also created. Thus, a task is a C language part of a coded model that operates as a separate process with its own timeline. A task can suspend operation of itself at a point in simulation time of the hardware model it is contained in, and resume operation at some future point in simulation time of that hardware model. The operation of the task thus can consume hardware simulation time.

A callback function herein refers to a section of a model that operates at a single instant in simulation time of the overall model. The section is typically coded in C-language or its derivatives. A callback function cannot suspend or resume operation of the hardware model, so that a callback function exits at the same instant in simulation time at which it is invoked. A callback function may be directly invoked from a task. A callback function may also be directly invoked from a callback function. Similarly, a callback function may be scheduled to be invoked by a task, or scheduled to be invoked by a callback function.

Callback functions are in one embodiment registered at initialization time to be associated with a particular clock signal for scheduling according to one or more attributes of the clock signal. Registering is also called "installing". When a callback function associated with a particular clock signal is registered, e.g., for later scheduling, a handle or identifier for that callback function, associated with a clock signal is generated and provided as a result of the registering. The handle provides a mechanism for scheduling an event, e.g., a callback to that callback function. If that event is in reference to a clock net, the handle specifying which clock net will have been provided during registration, so the handle for the callback function implicitly includes the handle for the associated clock signal.

For example, a callback function may be scheduled by the event scheduler 220 as a consequence of a simulation event, e.g., a logic signal or a clock signal, to which that callback function has been registered.

Note that a task need not be registered with the system, e.g., to provide a handle for that task, since the task is part of a section of a model and separate instances of a task are generated for each instance of the section of the model.

Both tasks and callback functions can cause the event scheduler 220 to schedule simulation events to occur. A simulation event can resume a task or invoke a callback function.

The inventors have found that callback functions provide greater flexibility and efficiency. Anything that can be implemented by a task can alternately be implemented by a callback function.

Note that while the inventors have added tasks and functions to provide for scheduling clock-net based events, an alternate implementation extends the Verilog, or other HDL to handle clock nets by providing native language primitives therefore.

In describing tasks and callback functions, the following notation and conventions are used herein:

Time$^{Current}$ denotes the current simulation time as indicated by the hardware simulation scheduler mechanism. Current simulation time values less than 0 are not defined.

Clock$^{Period}$ denotes the current value of the clock period for a particular clock signal. In one embodiment, a value of 0 for the clock period of a particular clock is used to indicate that that particular clock is stopped, and therefore, a clock period Clock$^{Period}$ that is more than 0 is used to indicate that the clock is active. In alternate embodiments, a logical quantity, e.g., a quantity denoted Clock$^{Active}$ is used to indicate whether or not a clock is stopped or active. Clock period values less than 0 are not defined.

Clock$^{CurrentCount}$ denotes the current value of the tick count for a particular clock signal. This value is calculated on request, and does not need to be stored by the hardware simulator or simulation scheduler. Clock tick count values less than 0 are not defined.

Clock$^{TimeNextTick}$ denotes the simulation time at which the next tick, of a particular clock signal, is expected to occur. This value is only meaningful if the clock signal is not stopped. This value is always greater than Time$^{Current}$. This value is calculated on request, and remains valid so long as the clock signal is not changed in the intervening simulation time. This value does not need to be stored by the hardware simulator or simulation scheduler.

Clock$^{TimeAtReference}$ denotes the current time of the reference point for a particular clock signal. From the reference point, up to and including the current simulation time, the clock signal's period has the value Clock$^{Period}$. The value of Clock$^{TimeAtReference}$ is always less than or equal to Time$^{Current}$ and is visible only to the hardware simulator 217 and its scheduler 220. This reference time is used as a reference when determining future ticks of the clock signal with its current value of Clock$^{Period}$. The value of Clock$^{TimeAtReference}$ and other details of the reference point are recalculated whenever any attribute of the particular clock signal is changed. The reference point does not necessarily represent a past tick of the clock signal.

$Clock^{CountAtReference}$ denotes the tick count of the reference point for a particular clock signal. From the reference point, up to and including the current simulation time, the clock signal's period has the value $Clock^{Period}$. This value is always less than or equal to $Clock^{CurrentCount}$, and is visible only to the hardware simulator 217 and its scheduler 220. The tick count $Clock^{CountAtReference}$, together with the simulation time $Clock^{TimeAtReference}$, of the reference point and the current period of the clock signal $Clock^{Period}$, are used when scheduling events based on clock tick counts into simulation time. The value of $Clock^{CountAtReference}$ and other details of the reference point are recalculated whenever any attribute of the particular clock signal is changed. The reference point does not necessarily represent a past tick of the clock signal.

All arithmetic operations, described in this description involving time, tick counts, period and other values, use integer arithmetic. The following operators are used in the following manner:

/ denotes the integer divide operation, discarding the remainder.

% denotes the integer modulo operation, that is, the remainder after integer divide.

* denotes multiplication.

TaskWaitSyncPlusTicks

The TaskWaitSyncPlusTicks task suspends the current task and resumes it a specified number of ticks, or significant transitions, after the first tick of a specified clock signal.

| Syntax: |
| --- |
| void TaskWaitSyncPlusTicks ( <br>    tClockHandle   Clock, <br>    tTicks   TickDelay <br> ); |

Arguments

Clock A handle (e.g., an identifier) for a clock signal, identifying a connection to a clock signal. That is, Clock is the identifier of the particular clock net (or signal).

TickDelay The number of ticks of the clock signal Clock, to further wait, before resuming the task.

Further Detail (1) The calling task will suspend immediately and resume after TickDelay+1 ticks of the referenced clock signal Clock.

(2) If a tick of the referenced clock signal occurs at the current simulation time T, then this tick is ignored, and the next tick, one clock period later, is taken as the first tick of the referenced clock signal Clock.

(3) If any of the referenced clock signal's attributes are changed during the time the task is suspended, the time at which the task is resumed is automatically rescheduled to align with the specified tick of the clock signal according to the new clock attributes.

(4) If the clock signal is stopped at the time this function is invoked then the calling task will remain suspended until the reference clock has been re-started and the requested number, TickDelay+1, ticks of the reference clock have occurred since the task suspended.

(5) This function should only be used within the execution of a task. This function should not be used within a callback function.

Detailed Operation of the Primitive/Function in one Embodiment

When TaskWaitSyncPlusTicks is invoked, the hardware simulator 217 immediately suspends the calling task.

If the referenced clock signal Clock is active, as indicated by a non-zero period, one embodiment of the simulation scheduler 220 predicts the simulation time at which the specified tick of the referenced clock signal Clock will occur and schedules the task's resumption. It will do this by first calculating the number of clock ticks which have occurred since the reference point for the clock signal, as follows:

$Clock^{CountSinceReference}=(Time^{Current}-ClockTime^{AtReference})/Clock^{Period}$;

In order to calculate the scheduled time for a clock-scheduled event, one embodiment of the simulation scheduler operates as follows:

$Clock^{CurrentCount}=Clock^{CountAtReference}+Clock^{CountSinceReference}$;

$Event^{ClockCountAtEvent}=Clock^{CurrentCount}+TickDelay+1$;

$Event^{Time}=(Clock^{CountSinceReference}+TickDelay+1)*Clock^{Period}+Clock^{TimeAtReference}$;

The simulation scheduler will then insert the task resumption event into two queues, the simulation scheduler 220's time-scheduled event queue 222, and a clock specific event queue, storing $Event^{ClockCountAtEvent}$ for future use should the event need to be rescheduled. When, in time, the event occurs and is processed, it will be removed from the time-scheduled event queue 222 and also removed from the clock-scheduled event queue for the particular clock signal. Processing typically includes transfer from the time-scheduled event queue 222 to the current queue 226.

If the referenced clock signal Clock has period of zero, indicating that the referenced clock signal Clock is stopped, the simulation scheduler will already have updated the reference point for the clock signal to its last tick. It may thus calculate $Event^{ClockCountAtEvent}$ as follows:

$Event^{ClockCountAtEvent}=Clock^{CountAtReference}+TickDelay+1$;

The simulation scheduler will then insert the task resumption event on to the clock specific event queue (in structure 228). There is no insertion into the time-scheduled event queue 222. When the referenced clock signal Clock is restarted, the events in the clock specific event queue for the referenced clock signal Clock will be scheduled on to the simulation scheduler's time-scheduled event queue 222 based on the then predicted time of each of the clock-scheduled events.

ClockGetPeriod

Gets the current value of the clock period of a clock signal. The clock period represents the number of simulation time units between repetitive ticks of the referenced clock. This time interval is also referred to as one clock tick with respect to the referenced clock signal Clock.

| Syntax |
| --- |
| tTime ClockGetPeriod (<br>    tClockHandle        Clock<br>); |

Arguments

Clock An identifier for a clock signal, identifying a connection to a clock signal. That is, Clock is the identifier of the particular clock net (or signal)

Return Value

The current clock period, greater than 0, for a clock signal, or, a value of 0 which indicates that the clock is currently stopped.

Further Detail (1) The value of the clock signal's period is read at current simulation time and may change thereafter.

(2) When, from a task or callback function, a clock signal's clock period is changed via the function ClockSetTickAndPeriod, this change is stored within the hardware model 18 by the hardware simulator and not propagated until the event scheduler 220's current event queue 226 has been exhausted. Any access to the function ClockGetPeriod invoked by a task or callback function resumed or invoked during the same iteration of the event scheduler's current event queue will return the clock signal's previous clock period.

Detailed Operation of if the Primitive/Function in one Embodiment (1) The hardware simulator immediately returns the current value of $Clock^{Period}$ for the referenced clock signal Clock.

ClockSetTickAndPeriod

Sets the time of next tick and the new clock period for a clock signal. These changes, when propagated throughout the hardware model 218 by the hardware simulator 217, cause the automatic rescheduling in time of all future clock tick based events which have been scheduled with respect to the referenced clock signal Clock.

| Syntax |
| --- |
| void ClockSetTickAndPeriod(<br>    tClockHandle        Clock,<br>    tTime                TickDelay,<br>    tTime                Period<br>); |

Arguments

Clock An identifier for a clock signal, identifying a connection to a clock signal. That is, Clock is the identifier of the particular clock net (or signal)

TickDelay The delay in simulation time units from current simulation time to the next tick of the referenced clock signal Clock. Must be greater than 0 and less than or equal to the new Period value.

Period The new value, in simulation time units, for the period of the referenced clock signal Clock.

Further Detail (1) The change to the clock signal's next tick and period take place at the current simulation time but do not affect the model 218 until propagated through the model during the hardware simulator's propagate phase.

(2) If the clock signal's period is set to 0 then the clock is stopped and the TickDelay is ignored.

(3) After the return from this function, and during the hardware simulators propagate phase, as a consequence of changing the current period for the clock signal or the position in time of its next tick, the simulation scheduler will reschedule all clock-scheduled events which use this clock as a reference to occur at their new appropriate simulation time. If the referenced clock signal Clock has been stopped, that is, clock period set to 0, then the simulation scheduler will prevent these clock-scheduled events from occurring until the clock is re-started, at which point the simulation scheduler will then reschedule these clock-scheduled events to occur at their new appropriate simulation time.

(4) If a tick of the clock signal was due to occur exactly at current time, then all clock-scheduled scheduled events which were scheduled to occur on this particular tick would already have been processed, so this tick is counted in $Clock^{CurrentCount}$, and no re-scheduling of these particular events occur.

Detailed Operation of if the Primitive/Function in one Embodiment (1A) If the referenced clock signal Clock has a new clock period value Period of 0 simulation time units and the current value of the clock signal's period ClockPeriod is not 0, then the referenced clock signal Clock is considered to be being stopped. In this case, the hardware simulator first updates the reference point for the referenced clock signal Clock up to the last tick of the clock signal which has occurred up to and including the current simulation time. This is achieved by calculating the time of the last tick of the clock signal, and moving the clock signal's reference point to this last tick as follows:

$Clock^{CountSinceReference} = (Time^{Current} - Clock^{TimeAtReference})/Clock^{Period}$;

$Clock^{CountAtReference} = Clock^{CountAtReference} + Clock^{CountSinceReference}$;

$Clock^{TimeAtReference} = Clock^{TimeAtReference} + Clock^{CountSinceReference} * Clock^{Period}$;

The clock reference point is recalculated using the previously set value of the clock signal's period. The hardware simulator then updates the clock signal's clock period as follows:

$Clock^{Period} = 0$;

The hardware simulator will then instruct the simulation scheduler to remove all events which have been scheduled using the referenced clock from the simulation scheduler's time-scheduled event queue. One way the scheduler can easily do this is by traversing the clock signal's specific event queue and removing these events from the scheduler's time-scheduled event queue. These events will remain inactive until the clock is re-started and the events are again placed on the scheduler's time-scheduled queue.

(1B) If the referenced clock signal Clock has a new clock period value which is not 0 simulation time units and the current value of the clock signal's period $Clock^{Period}$ is not 0, then the referenced clock signal Clock is considered to be active and changing phase or frequency, so the hardware simulator needs to accurately re-position the next clock tick. In this case, the hardware simulator first updates the reference point for the clock signal up to the last tick count of the clock signal which has occurred up to and including the current simulation time. It then positions the time of the reference point for the last tick of the clock signal as if this tick had occurred with the new clock period value, Period. The hardware simulator then updates the clock signal's clock period. These changes are achieved as follows:

$Clock^{CountSinceReference} = (Time^{Current} - Clock^{TimeAtReference})/Clock^{Period};$ $Clock^{CountAtReference} = Clock^{CountAtReference} + Clock^{CountSinceReference};$ $Clock^{TimeAtReference} = Time^{Current} + TickDelay - Period;$ $Clock^{Period} = Period;$ The hardware simulator 217 will then instruct the simulation scheduler to reschedule all events which have been scheduled using the referenced clock on the simulation scheduler's time-scheduled event queue. One way the scheduler can easily do this is by traversing the clock specific event queue and removing these events from the scheduler's time-scheduled event queue, calculate their new scheduled time, and then reinsert them. In order to calculate the new scheduled time for a clock-scheduled event, the scheduler may operate as follows:

$Event^{Time} = Clock^{Period} * (Event^{ClockCountAtEvent} - ClockCountAtReference) + Clock^{TimeAtReference};$ (1C) If the referenced clock signal Clock has a new non-zero clock period value, and prior to that, the current value of the clock signal's period $Clock^{Period}$ was 0, then the referenced clock signal Clock is considered to be being restarted. In this case, the hardware simulator has already updated the reference point for the clock signal up to the last tick of the clock signal which had occurred up to and including the time at which the clock signal was stopped. In response to the restarting of the clock, the hardware simulator then repositions the time of the reference point for the last tick of the clock signal as if this tick had occurred with the new clock period value, Period. The hardware simulator then updates the clock signal's clock period. These changes are achieved as follows:

$Clock^{TimeAtReference} = Time^{Current} + TickDelay - Period;$ $Clock^{Period} = Period;$ The hardware simulator will then instruct the simulation scheduler to schedule all pending events, which had been scheduled using the referenced clock, onto simulation scheduler's time-scheduled event queue. These events have already been removed from the simulation scheduler's time-scheduled event queue by the prior setting of the referenced clock signal Clock's period to 0, so the simulation scheduler needs only to schedule them again, onto the time-scheduled event queue. One way the scheduler 220 can easily do this is by traversing the clock specific event queue, calculating their new scheduled time, and then inserting them into the time-scheduled event queue. In order to calculate the new scheduled time for a clock-scheduled event, the scheduler may operate as follows:

$Event^{Time} = Clock^{Period} * (Event^{ClockCountAtEvent} - Clock^{CountAtReference}) + Clock^{TimeAtReference};$ (1D) If the referenced clock signal Clock has a new clock period value which is 0 simulation time units and the current value of the clock signal's period $Clock^{Period}$ is 0, then this function simply returns without any change to the referenced clock or clock-scheduled events as the clock remains in the stopped state.

ClockGetCount

Gets the number of the clock ticks of a referenced clock signal Clock to have occurred up to and including the current simulation time. This count is also referred to as a number of clock ticks with respect to the referenced clock signal Clock.

| Syntax |
| --- |
| tTicks ClockGetCount ( tClockHandle Clock ); |

Arguments
Clock An identifier for a clock signal, identifying a connection to a clock signal. That is, Clock is the identifier of the particular clock net (or signal).
Return Value
The number of the clock ticks of referenced clock signal Clock that have occurred up to and including current simulation time.
Further Detail
(1) The number of clock ticks returned is the number of edges or ticks of the referenced clock signal Clock that have occurred up to and including the current simulation time.
Detailed Operation of the Primitive/Function in one Embodiment
(1A) If the referenced clock signal Clock has a clock period value $Clock^{Period}$ of 0 simulation time units, then the referenced clock signal Clock is considered to be stopped. In this case $Clock^{CountAtReference}$ has already been updated to reflect the last clock tick count prior to being stopped, so $Clock^{CurrentCount}$ is equal to $Clock^{CountAtReference}$, and this value is returned.
(1B) If the referenced clock signal Clock's clock period value $Clock^{Period}$ is not 0, the value $Clock^{CurrentCount}$ is returned, calculated as follows:

$Clock^{CurrentCount} = (Time^{Current} - Clock^{TimeAtReference})/Clock^{Period} + Clock^{CountAtReference};$ ClockGetNextTick Gets the predicted time difference between the current simulation time and the next expected tick of a referenced clock.

| Syntax |
| --- |
| tTime ClockGetNextTick ( tClockHandle Clock ); |

Arguments
Clock An identifier for a clock signal, identifying a connection to a clock signal. That is, Clock is the identifier of the particular clock net (or signal).
Return Value
The predicted time difference between the current simulation time and the next expected tick the referenced clock signal Clock, or 0 if the referenced clock signal Clock is stopped.
Further Detail
(1) If a tick of referenced clock signal Clock occurred at the current time, then, unless the clock signal Clock's attributes have been changed and propagated through the model since the tick was generated, this function will return the clock signal Clock's current period.

(2) When, from a task or callback function, the referenced clock signal Clock's clock period or time to next tick is changed via the function ClockSetTickAndPeriod applied to Clock, this change is stored within the hardware model by the hardware simulator and not propagated through the model until the event scheduler's current event queue has been exhausted. Any access to the function ClockGetNextTick invoked by a task or callback function resumed or invoked during the same iteration of the event scheduler's current event queue will return the clock signal's previous expected time to next tick.

Detailed Operation of the Primitive/Function in one Embodiment (1A) If the referenced clock signal Clock has a clock period value $Clock^{Period}$ of 0 simulation time units, then the referenced clock signal Clock is considered to be stopped. In this case the function cannot predict the next tick of the referenced clock signal Clock, and returns 0 to indicate that the clock signal is stopped.

(1B) If the referenced clock signal Clock's clock period value $Clock^{Period}$ is not 0, the value $Clock^{TimeToNextTick}$ is returned, calculated as follows:

$$Clock^{CountSinceReference} = (Time^{Current} - Clock^{TimeAtReference})/Clock^{Period};$$

$$Clock^{TimeToNextTick} = (Clock^{CountSinceReference} + 1) \times Clock^{Period} + Clock^{TimeAtReference} - Time^{Current};$$

ClockAttachCallback

Installs a specified callback function that is automatically scheduled to be invoked when a clock net (referenced by this function) changes its clock period value or tick location.

| Syntax |
| --- |
| tStatus ClockAttachCallback( |
|     tClockHandle    Clock, |
|     tCallbackFunction  pCallbackFunction, |
|     void    \* pCallbackData |
| ); |

Arguments

Clock An identifier for a clock signal, identifying a connection to a clock signal. That is, Clock is the identifier of the particular clock net (or signal).

pCallbackFunction A pointer to the callback function to be invoked.

pCallbackData The parameter to be passed to the callback function when invoked.

Return Value

SUCCESS if successfully completed, otherwise FAIL.

Further Detail (1) When a clock signal's clock period or time to next tick is changed via the function ClockSetTickAndPeriod, this change is stored within the hardware model 218 by the hardware simulator 217. The change is not propagated through the model until after all events on the event scheduler's current event queue 226 have been processed. When these changes are propagated, during the hardware simulator's propagate phase, the attached callback function will be scheduled to be invoked at the same simulation time, but on the event scheduler's pending event queue 227, which once propagation of all hardware model changes is complete, becomes the event scheduler's new current event queue. The clock callback is then invoked.

Detailed Operation of The Primitive/Function in One Embodiment (1) When, from a task or callback function, a clock signal's clock period or time to next tick is changed via the function ClockSetTickAndPeriod, this change is stored within the hardware model by the hardware simulator. Once the event scheduler's current event queue is exhausted, the hardware simulator enters the propagate phase and as a result propagates the clock signal changes through the model, automatically scheduling an invocation to the attached clock callback function at current time. The event scheduler places this event on its pending event queue until the hardware simulator's propagate phase is complete. The event scheduler then moves this event, and all other events, from its pending event queue to its current event queue and passes these events, one at a time to the hardware simulator at which point the callback function is invoked.

SimulatorInstallClockedCallback

The function SimulatorInstallClockedCallback installs a specified callback function so that it may later be scheduled by the hardware model 218 to be invoked by the hardware simulator 217 on a particular tick of a reference clock.

| Syntax |
| --- |
| tClockedCallbackHandle SimulatorInstallClockedCallback ( |
|     tClockHandle    Clock, |
|     tCallbackFunction  pCallbackFunction, |
|     void \*    pCallbackData |
| ); |

Arguments

Clock An identifier for a clock signal, identifying a connection to a clock signal. That is, Clock is the identifier of the particular clock net (or signal).

pCallbackFunction A pointer to the callback function to be invoked.

pCallbackData The parameter to be passed to the callback function when invoked.

Return Value

The return value, if successfully completed, is a simulator callback handle, e.g., a token such as a pointer for the callback, otherwise NULL.

Further Detail (1) The returned clocked callback handle may be used to schedule the callback to be invoked on a particular tick of the referenced clock signal Clock through use of the function ClockedCallbackScheduleSyncPlusTicks.

Simulator ScheduleClockedCallbackSyncPlusTicks

Simulator ScheduleClockedCallbackSyncPlusTicks schedules a previously registered clocked callback function to be invoked a specified number of ticks, or ticks, after the first tick of the particular clock signal with which the simulator callback handle was registered.

Registering a callback function provides a handle for that callback function. Furthermore, the registering of a call back function related to a clock signal specifies which clock net is associated, such that scheduling a previously registered callback functions does not require specifying a handle for the clock net.

| Syntax |
| --- |
| void SimulatorScheduleClockedCallbackSyncPlusTicks (<br>    tClockedCallbackHandle CallbackHandle,<br>    tTicks                 TickDelay<br>); |

Arguments

CallbackHandle An identifier for the registered clocked callback event to be scheduled to occur.

TickDelay The number of ticks to further wait, of the clock signal with which the simulator clocked callback function was registered, before invoking the registered clocked callback function.

Further Detail (1) The registered clocked callback function will be invoked after (TickDelay+1) ticks of the particular clock signal with which the simulator clocked callback function was registered.

(2) If a tick of the callback function's particular clock signal occurs at the current simulation time, then this tick is ignored, and the next tick, one clock period later, is taken as the first tick of the particular clock signal.

(3) If the particular clock signal's properties are changed during the intervening time, the time at which the registered clocked callback function will be invoked is automatically rescheduled to align with the specified tick of the particular clock signal.

(4) If the particular clock signal is stopped at the time this Simulator ScheduleClockedCallbackSyncPlusTicks function is invoked then the calling registered clocked callback function will not be invoked until the callback function's referenced clock has been re-started and the requested number, TickDelay+1, ticks of the callback function's referenced clock have occurred since the call to this SimulatorScheduleClockedCallbackSyncPlusTicks function.

(5) The Simulator ScheduleClockedCallbackSyncPlusTicks function can be used within the execution of a task or callback function.

Detailed Operation in One Embodiment (1) If the callback function's referenced clock has a non-zero clock period, indicating that the callback function's referenced clock signal is currently active (not stopped), then the simulation scheduler will predict the simulation time at which the specified tick of the callback function's referenced clock signal will occur and schedule an event to invoke the registered clocked callback function. It will do this by first calculating the number of clock ticks which have occurred since the reference point for the clock signal, as follows:

$$Clock^{CountSinceReference} = (Time^{Current} - Clock^{TimeAtReference})/Clock^{Period};$$

In order to calculate the scheduled time for a clock-scheduled event, the simulation scheduler may operate as follows:

$$Clock^{CurrentCount} = Clock^{CountAtReference} + Clock^{CountSinceReference};$$

$$Event^{ClockCountAtEvent} = Clock^{CurrentCount} + TickDelay+1;$$

$$Event^{Time} = (Clock^{CountSinceReference} + TickDelay+1)*Clock^{Period} + Clock^{TimeAtReference};$$

(2A) The simulation scheduler will then insert the task resumption event into two queues, the simulation scheduler's time-scheduled event queue, and a clock specific event queue, storing $Event^{ClockCountAtEvent}$ for future use should the event need to be rescheduled. When, in time, the event is due to occur, it will be removed from both queues.

(2B) If the callback function's referenced clock signal has period of zero, indicating that the referenced clock signal is stopped, the simulation scheduler will have already updated the reference point for the clock signal to its last tick. The simulator scheduler 220 may thus calculate $Event^{ClockCountAtEvent}$ as follows:

$$Event^{ClockCountAtEvent} = Clock^{CountAtReference} + TickDelay+1;$$

The scheduler 220 will then insert the event to invoke the registered clocked callback function only on to the clock specific event queue for the callback function's referenced clock signal. When the callback function's referenced clock is restarted, the events in the clock specific event queue will be scheduled on to the simulation scheduler's time-scheduled event queue based on the then predicted time of each of the callback function's referenced clock-scheduled events.

Simulator CancelClockedCallback

Simulator CancelClockedCallbac Cancels a scheduled invocation of a registered and scheduled clocked callback function.

| Syntax |
| --- |
| void SimulatorCancelClockedCallback (<br>    tClockedCallbackHandle CallbackHandle<br>); |

Arguments

CallbackHandle A handle such as an identifier for the registered and scheduled clocked callback function, whose scheduled event is to be cancelled.

Thus has been described extensions to the Verilog Programming Language syntax which can be applied to the Verilog Programmable Logic Interface (PLI) to include the capability for clock-based scheduling of events. By using an embodiment of the hardware simulator 217 that includes the event scheduler 220 and that understands and implements the above described extensions, devices, such as timers, clock generators and counters can be accurately implemented without the need to simulate each clock transition of a clock signal as an event, even when the timing of the clock signal is subject to variation such as would arise through reprogramming of a clock generator or gating of some clock signal.

The effect of an edge of a clock net some time in the future can be invoked in several ways. In one embodiment, a callback function for the number of clock edges ("ticks") of a particular clock net, e.g., a particular clock signal—is placed on the time-scheduled event queue in 222 for invocation at some future time. This future time is determined by scheduler 220 from the current period of the clock signal and other relevant attributes of the clock signal. Any changes in the period of the clock signal in the intervening interval of simulation time automatically, through the event scheduler 220, cause a consequential change in the time at which the callback is invoked. The event scheduler knows the events on the time-scheduled event queue are related to the clock net. Thus the events are in the clock-scheduled event queue in 228, and at least one is in the time-scheduled event queue. An event from the time-scheduled event queue may invoke, for example, a callback function. That callback function may then cause the clock attributes to change. As a consequence, the scheduler now changes any events as necessitated by the change of attributes.

In an alternate embodiment, rather than a callback function being placed in the clock-scheduled event queue, and eventually in a time-scheduled event queue for later invocation according to one or more attributes of a clock net, e.g., a clock signal, a task is used to implement similar functionality: that of an action occurring a number of ticks of a particular clock net into the future. According to such other embodiment, the task suspends itself for the number of ticks, and a task resumption event is placed on one of the event queues for action at some future time. Note such resumption can be via the clock-scheduled event queue or directly into the time-scheduled event queue. The resumption may also happen by the task being resumed by some callback function. This future time is determined by scheduler 220 from the current period and other relevant attributes of the particular clock net. Any changes in the clock net's period in the intervening interval of simulation time automatically, through the scheduler 220, causes a consequential change in the time at which the task is resumed.

As stated earlier, the inventors prefer using callback functions. However, the invention is not limited by any particular method, including, for example, using neither callback functions nor tasks, but rather by extending the hardware description language to include the required functionality.

Thus using a callback function that is invoked at some future time according to one or more attributes of a clock net, and thus using a task whose operation is suspended until some future time according to one or more attributes of a clock net, allow the behavior of the device to be accurately modeled, whilst simplifying the design of the device and removing the simulation overhead of simulating every clock transition.

Thus, when simulating a clocked circuit, e.g., a circuit that monitors one or more clock signals, efficiency is achieved by using clock-scheduled scheduling rather than only using clock-scheduled event by clock-scheduled event simulation.

An example is now used to illustrate how this is achieved in one embodiment. Consider again the relatively simple circuit shown in FIG. 3.

Figure 4:
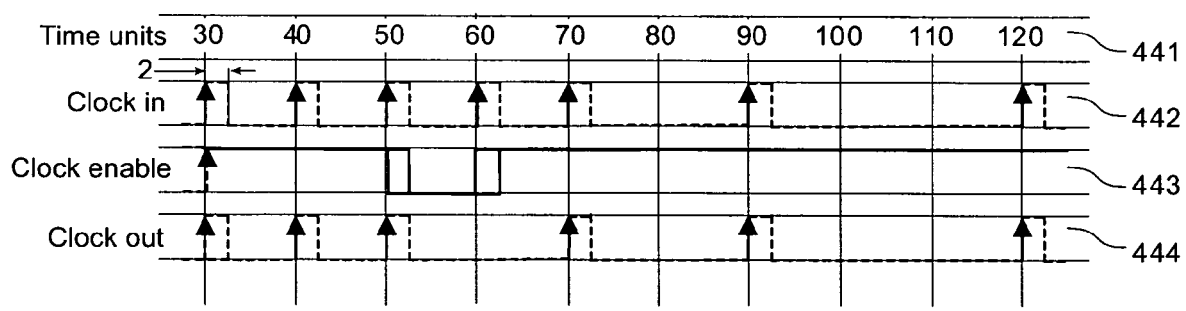
FIG. 4 shows the characteristics of the clock signal output from the clock generator circuit in FIG. 3, and, the timing relationship expected between input and output signals for the clock gate circuit in FIG. 3.

FIG. 3 shows a first clock generator circuit 331 that outputs a variable clock signal connected to a second clock gate circuit 332 and that forms the Clock in input to the circuit 332. The clock in timing 442, detailed in FIG. 4, shows that at simulation time 70, under control of circuitry not shown in this example, the clock generator circuit changes from generating a clock output of period 10 time units, to generating a clock output of period 230 time units. The short 220 time unit delay to the first subsequent transition at time 90 for the clock in signal is indicative of the clock period change occurring out of phase with the new clock in signal period of 230 time units.

The clock gate circuit 332 has a clock enable input signal 443, which is produced from a clocked circuit not shown. The function of the clock gate circuit 332 is to produce a clock out signal 444 which connects to a timer clock input 553 to a third four-tick timer circuit 333. The operation of the clock gate circuit 332 is shown in FIG. 4, where the clock enable signal 443 at time 50 is clocked to a 0 state, and to a 1 state at time 60, resulting in the clock out signal 444 at time 60 omitting, or gating out, the corresponding clock pulse at time 60 from the input clock in signal 442. All other clock pulses on the clock in input signal 442 are transferred through the clock gate 332 to the clock output signal 444 and to the corresponding four-tick timer circuit 333 to timer clock input signal 553 shown in FIG. 5.

Figure 5:
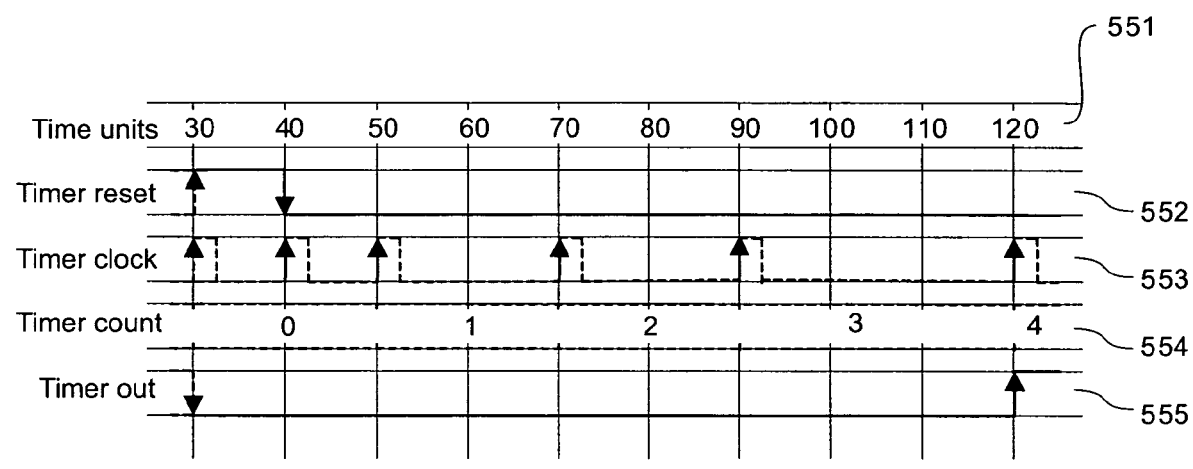
FIG. 5 shows the timing relationship expected between input and output signals for the four-tick timer circuit in FIG. 3.

The four-tick timer circuit 333 has, in addition to the timer clock input signal 553, a timer reset input signal 552 shown in FIG. 5, which is produced from a clocked circuit not shown. The function of the four-tick timer circuit 333 is to produce a timer out signal 334, some 4 clock transitions after the timer reset signal 552 has been de-asserted at time 40. The expected timer out output signal 555 is shown in FIG. 5, which also shows the expected internal state 554 of the four-tick timer 333.

As described above, using a simulation system such as shown in FIG. 1B, consider first the clock generator circuit 331. The scheduler 113, as a result of modeling this clock generator 331, produces a series of clock transition events and places these events in sequence on the scheduler 113's time ordered event queue in structure 115. These events are generated one at a time by the clock generator as time is advanced by the simulation scheduler. Suppose, for example, that each clock signal is two simulation time-units wide, such that after a 0-to-1 edge, the signal returns to 0 two time units later. In order to generate the clock signal output from the clock generator 331, and ignoring any internal complexity in the clock generator 331, the event scheduler 113 of FIG. 1B schedules the events in the main time-ordered time-scheduled event queue in structure 115 as described in Table 1 below:

TABLE 1

Events in 115 (FIG. 1B) for Clock generator 331

| Simulation time | Event scheduled |
| --- | --- |
| 230 | Clock = 1 |
| 332 | Clock = 0 |
| 40 | Clock = 1 |
| 442 | Clock = 0 |
| 50 | Clock = 1 |
| 552 | Clock = 0 |
| 60 | Clock = 1 |
| 62 | Clock = 0 |
| 70 | Clock = 1 |
| 72 | Clock = 0 |
| 90 | Clock = 1 |
| 92 | Clock = 0 |
| 120 | Clock = 1 |
| 122 | Clock = 0 |

Even through the circuit of FIG. 3 is sensitive only to 0-to-1 transitions of the clock signal from circuit 331, each important transition generates two events using a purely time-scheduled event prior art simulator such as shown in FIG. 1B: a rising edge and a falling edge for each clock signal pulse, since the clock signal is treated as a logic level signal. Furthermore, each clock pulse is scheduled in the main queue in 115, regardless of the clock pulse's repetitive nature.

Consider next the clock gate circuit 332 which only passes clock pulses from the Clock in signal input 442 to its Clock out signal output 444 when the Clock enable signal input 443 is active, i.e., value 1, on a 0-to-1 transition of the clock in signal 442. This may be modeled by prior art simulator including a scheduler such as 113 and a model such as 112 as follows (in pseudo-code):

```
on detection of a 0 → 1 transition of Clock in
    if Clock enable = 1,
        schedule Clock out = 1
on detection of a 1 → 0 transition of Clock in
    if Clock out is equal to 1,
        schedule Clock out = 0
```

Now consider the four-tick timer circuit 333 which produces a Timer out signal 555, (connected to 334) after the timer Reset input signal remains inactive, i.e., value 0, for four 0-to-1 transitions of its Timer clock input signal 442. This may be modeled by a prior art simulator including a scheduler such as 113 and a model such as 112 as follows (in pseudo-code):

```
on detection of 0 → 1 transition of Timer clock
    if Timer reset is equal to 0
    {
        if Timer count < 4
        Timer count = Timer count + 1
            else
                schedule Timer out = 1
    }
on detection of 0 → 1 transition of Timer reset
    {
        Timer count = 0
        schedule Timer out = 0
    }
```

An undesirable consequence of this method of modeling is that, in order to model the exemplary simple circuit of FIG. 3, each clock transition event would have to be scheduled, and notably, that each enabled transition of the clock gate Clock in signal 442 results in the scheduling of a transition of the clock gate Clock out signal 444 which, in turn, results in the invocation of the four-tick timer model in order to increment its internal timer count variable 554. This requires many events to be scheduled, and many operations to be performed by the host processor running the simulator How to simulate the same circuit of FIG. 3 is now described using aspects of the present invention, operating on a simulation system such as shown in FIGS. 2A and 2B using one or more of the tasks and callback functions defined herein above.

Referring to FIG. 3, the clock generator 331 produces a series of clock trick (the clock signal Clock in) which are first placed 10 time units apart. At some time, prior to the time interval 441 shown in FIG. 4, say, at time 0, one programs the behavior of the clock causing the scheduler 220 to schedule the following clock-scheduled event on the structure 228 for the clock-scheduled event queues. Such pseudocode is in one embodiment:

Time 0 Schedule Clock in, TimeToTransition=10, Period=10

Using the embodiment of the hardware simulator 217 including the scheduler interface 220 understanding the callback functions and tasks described above, the above scheduling can be, for example, carried out by invoking function ClockSetTransitionAndPeriod at time 0 with the TransitionDelay set to 10 and the Period set to 10.

At time 70, in response to some internal change of state of the clock generator circuit 331, one programs the behavior of the clock causing the scheduler 220 to schedule the following event on the structure 228 for the clock-scheduled event queues:

Time 70 Schedule Clock in, TimeToTransition=20, Period=30

This event at time 70 may also be scheduled by the ClockSetTransitionAndPeriod function.

These two ClockSetTransitionAndPeriod functions schedulings achieve the same result as the multiple events described above for a prior art circuit.

Now consider the clock gate circuit 332 which only passes clock pulses from its Clock in signal 442 to its Clock out signal 444 when the Clock enable signal 443 is sampled active, value '1', on a 0-to-1 transition of its clock in signal 442. This may be modeled as follows:

```
on detection of 0 → 1 transition of Clock enable
    Schedule Clock out,
        TimeToTransition = TimeToTransition of Clock in,
        Period = Period of Clock in
on detection of 1 → 0 transition of Clock enable
    Schedule Clock out,
        TimeToTransition = Don't Care,
        Period = 0
```

Finally, consider the four-tick timer circuit 333 which produces a timer out signal 334, 555) after the timer reset input signal remains inactive, value '0', for 4, 0→1 transitions of its timer clock input signal 442. This may be modeled by the following pseudocode:

```
on detection of 0 → 1 transition of Timer reset
{
    schedule Timer out = 0
    clock-cancel Timeout event
}
on detection of 1 → 0 transition of Timer reset
{
    clock-schedule Timeout event on 4 transitions
        of Timer clock
}
on Timeout event
    schedule Timer out = 1
```

The exemplary clock net structures described in detail herein deal only with transitions of a clock signal on the basis, as is typical of most modern circuits, that logic signal transitions are clocked so as to occur on either logical rising edge transitions (0-to-1) or on logical falling edge transitions (1-to-0) of clock signals, but not both. The invention, however, is not limited to one or the other, and may be applied to clocked circuits where both rising and falling edge transitions of the clock signal are significant, or to model circuits involving clock signals with more complex, but still repetitive characteristics. For example, one embodiment may be extended to represent the clock signal in terms of multiple transitions per clock period with corresponding extension to the detailed sample hardware simulator interface. For example, in order to model two transitions, a rising and a falling edge, per clock period, a second clock reference point, and a mechanism, e.g., in a language, to set and get the time to the corresponding second transition may be added to the described syntax of the functions and tasks described above, along with a mechanism of scheduling events to occur on one or the other of such transition.

One embodiment also significantly simplifies the task of modeling a complex clocked circuit by modeling clock transitions on original time event queues rather than on delta time event queues. In a purely time-scheduled event scheduling hardware simulator, modeling a complex clocked circuit with clock signals that are represented in the same manner as logic signals may result in clock transition events being placed on delta time event queues. This may result in race conditions within the model, and spurious, even random-like results may occur because of the unpredictable sequence in which events are processed within a delta time event queue. A hardware simulator such as that shown in FIGS. 2A and 2B effectively circumvents such problems by processing all clocked and timed events prior to events caused by state changes within the model. By distinguishing clocked events and logic events, the inventors provide a mechanism that avoids clocked events occurring in delta queues.

Thus have been described a method of simulating a circuit that includes clock nets. Further, a simulation system has been described that includes a scheduler that schedules both time-scheduled events, as is commonly known, and also clock-scheduled events that are re scheduled to occur according to one or more attributes of a clock net. Furthermore, thus has been described a programming interface including callback functions and tasks that provide for so scheduling clock-scheduled events.

The methodologies described herein are, in one embodiment, performable by a machine which includes a one or more processors that accept code segments containing instructions. For any of the methods described herein, when the instructions are executed by the machine, the machine performs the method. Any machine capable of executing a set of instructions (sequential or otherwise) that specify actions to be taken by that machine are included. Thus, a typical machine may be exemplified by a typical processing system that includes one or more processors. Each processor may include one or more of a CPU, a graphics processing unit, and a programmable DSP unit. The processing system further may include a memory subsystem including main RAM and/or a static RAM, and/or ROM. A bus subsystem may be included for communicating between the components. If the processing system requires a display, such a display may be included, e.g., an liquid crystal display (LCD) or a cathode ray tube (CRT) display. If manual data entry is required, the processing system also includes an input device such as one or more of an alphanumeric input unit such as a keyboard, a pointing control device such as a mouse, and so forth. The term memory unit as used herein also encompasses a storage system such as a disk drive unit. The processing system in some configurations may include a sounds output device, and a network interface device. The memory subsystem thus includes a carrier medium that carries machine readable code segments (e.g., software) including instructions for performing, when executed by the processing system, one of more of the methods described herein. The software may reside in the hard disk, or may also reside, completely or at least partially, within the RAM and/or within the processor during execution thereof by the computer system. Thus, the memory and the processor also constitute a carrier medium carrying machine readable code.

In alternative embodiments, the machine operates as a standalone device or may be connected, e.g., networked to other machines, in a networked deployment, the machine may operate in the capacity of a server or a client machine in a server-client network environment, or as a peer machine in a peer-to-peer or distributed network environment. The machine may be a personal computer (PC), a tablet PC, a set-top box (STB), a Personal Digital Assistant (PDA), a cellular telephone, a web appliance, a network router, switch or bridge, or any machine capable of executing a set of instructions (sequential or otherwise) that specify actions to be taken by that machine.

Note that while some diagram(s) only show(s) a single processor and a single memory that carries the code, those in the art will understand that many of the components described above are included, but not explicitly shown or described in order not to obscure the inventive aspect. For example, while only a single machine is illustrated, the term "machine" shall also be taken to include any collection of machines that individually or jointly execute a set (or multiple sets) of instructions to perform any one or more of the methodologies discussed herein.

Thus, one embodiment of each of the methods described herein is in the form of a computer program that executes on a processing system, e.g., a one or more processors that are part of simulation system. Thus, as will be appreciated by those skilled in the art, embodiments of the present invention may be embodied as a method, an apparatus such as a special purpose apparatus, an apparatus such as a data processing system, or a carrier medium, e.g., a computer program product. The carrier medium carries one or more computer readable code segments for controlling a processing system to implement a method. Accordingly, aspects of the present invention may take the form of a method, an entirely hardware embodiment, an entirely software embodiment or an embodiment combining software and hardware aspects. Furthermore, the present invention may take the form of carrier medium (e.g., a computer program product on a computer-readable storage medium) carrying computer-readable program code segments embodied in the medium.

The software may further be transmitted or received over a network via the network interface device. While the carrier medium is shown in an exemplary embodiment to be a single medium, the term "carrier medium" should be taken to include a single medium or multiple media (e.g., a centralized or distributed database, and/or associated caches and servers) that store the one or more sets of instructions. The term "carrier medium" shall also be taken to include any medium that is capable of storing, encoding or carrying a set of instructions for execution by the machine and that cause the machine to perform any one or more of the methodologies of the present invention. A carrier medium may take many forms, including but not limited to, non-volatile media, volatile media, and transmission media. Non-volatile media includes, for example, optical, magnetic disks, and magneto-optical disks. Volatile media includes dynamic memory, such as main memory. Transmission media includes coaxial cables, copper wire and fiber optics, including the wires that comprise a bus subsystem. Transmission media also may also take the form of acoustic or light waves, such as those generated during radio wave and infrared data communications. For example, the term "carrier medium" shall accordingly be taken to included, but not be limited to, solid-state memories, optical and magnetic media, and carrier wave signals.

It will be understood that the steps of methods discussed are performed in one embodiment by an appropriate processor (or processors) of a processing (i.e., computer) system executing instructions (code segments) stored in storage. It will also be understood that the invention is not limited to any particular implementation or programming technique and that the invention may be implemented using any appropriate techniques for implementing the functionality described herein. The invention is not limited to any particular programming language or operating system.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner, as would be apparent to one of ordinary skill in the art from this disclosure, in one or more embodiments.

Similarly, it should be appreciated that in the above description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

All publications, patents, and patent applications cited herein are hereby incorporated by reference.

In the claims below and the description herein, the term "comprising" or "comprised of" or "which comprises" is an "open" term that means including at least the elements/features that follow, but not excluding others. The term "including" or "which includes" or "that includes" as used herein is also an "open" term that also means including at least the elements/features that follow the term, but not excluding others. Thus, including is synonymous with and means comprising.

Thus, while there has been described what are believed to be the preferred embodiments of the invention, those skilled in the art will recognize that other and further modifications may be made thereto without departing from the spirit of the invention, and it is intended to claim all such changes and modifications as fall within the scope of the invention. For example, any formulas given above are merely representative of procedures that may be used. Functionality may be added or deleted from the block diagrams and operations may be interchanged among functional blocks. Steps may be added or deleted to methods described within the scope of the present invention.

We claim:

1. A method of electronically simulating a digital circuit operating with one or more clock signals, a clock signal being a signal having one or more attributes that provide for determining the time of the next clock signal driven event, the method comprising:

electronically forming a hardware model representing the circuit, in a simulation;

scheduling one or more time-scheduled events according to the model in a time-scheduled event data structure, a time-scheduled event being an event whose occurrence time in a simulation time frame is defined by reference to a simulation time;

scheduling one or more clock-scheduled events according to the model in a clock-scheduled event data structure, a clock-scheduled event being an event whose occurrence time is defined relative to one or more attributes of at least one clock signal in the circuit;

electronically predicting the occurrence time of the clock-scheduled events; and at any particular simulation time, processing the time-scheduled events for the particular simulation time and clock-scheduled events predicted to occur at the particular simulation time;

wherein clocked-scheduled events are distinguishable from time-scheduled events, and wherein each and every transition of any clock signal need not be scheduled in the time-scheduled event data structure.

2. The method as recited in claim 1, wherein at least one clock signal is a repetitive clock signal, and wherein the attributes of the repetitive clock signal include at least one of the set consisting of the current value of the repetition period, an indication of whether or not the repetitive clock signal is stopped, an indication of the number of ticks of the repetitive clock signal since a reference point in time, the simulation time corresponding to the reference point, and the time increment from the present simulation time to the next tick of the repetitive clock signal, a tick being a significant edge of the repetitive clock signal.

3. The method as recited in claim 2, wherein predicting the occurrence time of the clock-scheduled events includes scheduling such events on the time-scheduled event data structure, wherein processing the time-scheduled events for the particular simulation time automatically includes processing the clock-scheduled events predicted to occur at the particular simulation time.

4. The method as recited in claim 2, wherein the time-scheduled event data structure is a first queue, and wherein the clock-scheduled event data structure is a second queue.

5. The method as recited in claim 2, wherein processing the time-scheduled and clock-scheduled events for the particular simulation includes:

(a) treating the events in the time-scheduled event data structure scheduled to occur at the particular simulation time in the time-scheduled event data structure as a current event data structure;

(b) processing the events in the current event data structure;

(c) during processing, scheduling any events for processing at the current simulation time in a pending event data structure;

(d) after all the events in the pending event data structure are processed and the effect of such processing propagated through the model; and (e) repeating (b), (c), and (d) until there are no more events scheduled to be processed at the particular simulation time, and wherein the clock-scheduled events are such that no clock-scheduled events are scheduled in a pending event data structure.

6. The method as recited in claim 2, wherein the model of the digital circuit is coded in a hardware description language extended to include primitives that provide for scheduling clock based events according to one or more attributes of a clock signal.

7. The method as recited in claim 6, wherein the primitives are new commands in the hardware description language.

8. The method as recited in claim 6, wherein the primitives comprise one or more tasks and callback functions callable from the hardware description language, a task being a section of the model such that when an instance of the model is set up during an initialization step, instances of any tasks in the model are also created, and such that a task can suspend operation of itself at a point in simulation time of the hardware model it is contained in, and resume operation at some future point in simulation time of that hardware model, and a callback function being a section of the model that operates at a single instant in simulation time of the model, a callback function being able to directly invoked from a callback function, or being schedulable to be invoked by a task or a callback function.

9. A computer-readable storage medium containing computer readable code, that when executed by a processor, causes the processor to implement a hardware simulator, the simulator comprising:
   a hardware simulator model constructed from a description of a digital circuit, the digital circuit including a clock signal;
   a time-scheduled event data structure for scheduling time-scheduled events, a time-scheduled event being an event whose occurrence time in a simulation time frame is defined by reference to a simulation time;
   a clock-scheduled event data structure for scheduling clock-scheduled events, a clock-scheduled event being an event whose occurrence time is defined relative to one or more attributes of a referenced clock signal; and
   an event scheduler arranged to schedule one or more time-scheduled events in the time-scheduled event data structure according to the model, and to schedule one or more clock-scheduled events according to the model,
   the hardware simulator being arranged, when simulating the hardware model, to predict the simulation time of the clock-scheduled events and at any particular simulation time, process the time-scheduled events for the particular simulation time and clock-scheduled events predicted to occur at the particular simulation time,
   such that clocked-scheduled events are distinguishable from time-scheduled events, and such that each and every transition of any clock signal need not be scheduled in the time-scheduled event data structure.

10. The computer-readable storage medium as recited in claim 9, wherein, for particular event scheduled in the clock-scheduled event data structure with reference to one or more attributes of a particular clock signal, the hardware simulator is arranged when simulating the hardware model, to insert the particular clock-based event into the simulator's time-scheduled event data structure at the predicted time of occurrence, wherein processing the time-scheduled events for the particular simulation time includes processing the clock-scheduled events predicted to occur at the particular simulation time.

11. The computer-readable storage medium as recited in claim 10, wherein, for a particular clock-scheduled event inserted into the time-scheduled event data structure, the hardware simulator is arranged to keep track of the particular clock-scheduled event in the time-scheduled event data structure and in the clock-based event data structure as being dependent upon the current state of the particular clock signal, such keeping track of the current state of the particular clock signal providing for modeling clock signals whose attributes change in time.

12. The computer-readable storage medium as recited in claim 11, wherein the hardware simulator is arranged to cause the scheduler to automatically re-schedule events in terms of clock ticks when one or more of the attributes of the clock are changed in an intervening period between the original scheduling of the clock-based event and the occurrence time of the event.

13. The computer-readable storage medium as recited in claim 10, wherein processing events scheduled in the time-scheduled event data structure to occur at the present simulation time may generate one or more further events scheduled to occur at the present simulation time, wherein such further events are scheduled in a first pending event data structure, wherein the processing of events in the first pending event data structure may cause additional events to be scheduled into another pending event data structure for events scheduled to be processed at the present time, and wherein clock-scheduled events originally scheduled in the clock-scheduled event data structure are only scheduled into the time-scheduled event data structure,
   wherein scheduling clock-scheduled events into any pending event data structure is avoided.

14. A computer-implemented method of simulating a digital circuit, the circuit including one or more elements and at least one clock signal, each clock signal having one or more attributes, including the clock signal's period in units of a simulation, the method comprising:
   electronically maintaining a data structure for simulating the occurrence on the digital circuit, of time-scheduled events, each time-scheduled event scheduled to occur at a particular simulation-time; and
   electronically maintaining a data structure for simulating the occurrence on the digital circuit, of clock-scheduled events, each clock-scheduled event corresponding to a particular clock signal and scheduled to occur at a time that can be determined from one or more attributes of the clock signal,
   such that clocked-scheduled events are distinguishable from time-scheduled events, and such that each and every transition of any clock signal need not be scheduled in the time-scheduled event data structure.

15. A method as recited in claim 14, wherein the clock signal attributes include at least one of the set consisting of the value of the clock period at the current simulation time, an indication of whether or not the clock signal is stopped, an indication of the number of ticks of the clock signal since a reference point in time, the simulation-time corresponding to the reference point, and the simulation-time increment from the present simulation-time to the next tick of the clock signal, a tick being a significant edge of the clock signal.

16. A computer-based system for simulating a digital circuit comprising:
   a processor; and
   an instruction memory in communication with the processor for storing a plurality of processing instructions for directing the processor to:
      create a hardware simulator to simulate a digital circuit operating with one or more clock signals;
      accept code generated from a hardware model of a digital circuit defined in a language, the digital circuit operating according to a clock signal having one or more attributes, the attributes including at least one of the set consisting of the value of the clock period at the current simulation time, an indication of whether or not the clock signal is stopped, an indication of the number of ticks of the clock signal since a reference point in time, the simulation-time corresponding to the reference point, and the simulation-time increment from the present simulation-time to the next tick of the clock signal, a tick being a significant edge of the clock signal; and execute the hardware simulator operating according to the hardware model, the simulator including a scheduler arranged to be able to
(a) create a clock-scheduled event data structure to schedule a clock-scheduled event at a first simulation-time in the future determinable from one or more provided parameters of the clock signal; and
(b) create a time-scheduled event data structure to schedule a time-scheduled event at a second simulation-time in the future defined by a provided or determined value of simulation time or simulation time delay;
wherein the simulator is arranged to process the scheduled events,
the system such that clocked-scheduled events are distinguishable from time-scheduled events, and such that each and every transition of any clock signal need not be scheduled in the time-scheduled event data structure.

17. The computer-based system as recited in claim 16, wherein the language for defining the hardware model includes primitives provided for defining the clock signal, and for scheduling clock-scheduled events according to one or more attributes of the clock signal.

18. The computer-based system as recited in claim 17, wherein the language is an available hardware description language that includes a mechanism for calling functions, and wherein the primitives include at least one function callable from the hardware description language using the calling mechanism.

19. The computer-based system as recited in claim 18, wherein the available hardware description language is Verilog or a derivative thereof.

20. The computer-based system as recited in claim 18, wherein the available hardware description language is VHDL or a derivative thereof.

21. The computer-based system as recited in claim 18, wherein the available hardware description language is SystemC or a derivative thereof.

22. The computer-based system as recited in claim 17, wherein the language is an available hardware description language, and wherein the primitives include at least one additional command, such additional at least commands and the available hardware description language defining an extended version of the hardware description language.

23. The computer-based system as recited in claim 22, wherein the available hardware description language is Verilog or a derivative thereof.

24. The computer-based system as recited in claim 22, wherein the available hardware description language is VHDL or a derivative thereof.

25. The computer-based system as recited in claim 22, wherein the available hardware description language is SystemC or a derivative thereof.

26. The computer-based system as recited in claim 17, wherein the language is a hardware description language, and wherein the primitives are callable from the hardware description language.

27. The computer-based system as recited in claim 16, wherein the time-scheduled events are scheduled on a time-scheduled event data structure,
wherein the clock-scheduled events are scheduled on a clock-scheduled event structure, and
wherein the simulator is arranged to determine the next simulation time of occurrence of each clock-scheduled event in the clock-scheduled event, and to schedule such event in the time-scheduled event queue,
the simulator arranged, such that, upon alteration of an attribute of the clock signal, the simulator automatically alters in the time-scheduled event data structure the simulation-time of next occurrence of each clock-scheduled events whose occurrence simulation-time is dependant on that clock signal.

28. The computer-based system as recited in claim 27,
wherein the simulator is arranged, upon stopping of the clock signal, to automatically remove from the time-scheduled event data structure, all time-scheduled events that were scheduled from corresponding clock-scheduled events according to the clock signal, and to keep track of such clock-scheduled events, and
wherein the simulator is arranged, upon re-starting of the clock signal, to determine the next simulation time of occurrence of each clock-scheduled event in the clock-scheduled event data structure that depends on the restarted clock, and to re-schedule such event in the time-scheduled event data structure.

29. A method of electronically simulating a digital circuit, the method including the steps of:
(a) electronically providing a simulated clock signal simulating a digital clock signal having periodic significant transitions, and having one or more attributes;
(b) scheduling one or more clock-scheduled events to occur according to the circuit and one or more values of corresponding attributes of the clock signal in the circuit, a clock-scheduled event being an event whose occurrence time is defined relative to the one or more attributes of the clock signal in the circuit; and
(c) for a scheduled clock-based event, electronically determining the next simulation time in the future for the clock-scheduled event to occur from one or more provided or determined properties of the clock signal, and scheduling the event to occur at the determined simulation time in a time-scheduled event data structure.

30. The method as recited in claim 29, wherein one attribute of the clock signal is the clock period further comprising:
(d) altering the period of the simulated clock signal; and
(e) upon the alteration of the clock period, updating determined next simulation time for the event to occur, and rescheduling the event to occur at the updated determined time.

31. The method as recited in claim 29, wherein the digital circuit includes a timer circuit driven by the clock signal, and wherein one of the clock-scheduled events is described according to a count of ticks of the clock signal.

32. An apparatus for simulating a digital circuit operating with one or more clock signals, a clock signal being a signal having one or more attributes that provide for determining the time of the next clock signal driven event, the apparatus comprising:
a processor; and
a model memory in communication with the processor for storing a hardware model representing the circuit in a simulation;
means for accepting the hardware model;
means for scheduling one or more time-scheduled events according to the model memory in a time-scheduled event data structure, a time-scheduled event being an event whose occurrence time in a simulation time frame is defined by reference to a simulation time, and
means for scheduling one or more clock-scheduled events according to the model memory in a clock-scheduled event data structure, a clock-scheduled event being an event whose occurrence time is defined relative to one or more attributes of at least one clock signal in the circuit;

means for predicting the occurrence time of the clock-scheduled events; and means for processing events, the processing means at any particular simulation time processing the time-scheduled events for the particular simulation time and clock-scheduled events predicted to occur at the particular simulation time, such that clocked-scheduled events are distinguishable from time-scheduled events, and such that each and every transition of any clock signal need not be scheduled in the time-scheduled event data structure.

33. The Apparatus as recited in claim 32, wherein at least one clock signal is a repetitive clock signal, and wherein the attributes of the repetitive clock signal include at least one of the set consisting of the current value of the repetition period, an indication of whether or not the repetitive clock signal is stopped, an indication of the number of ticks of the repetitive clock signal since a reference point in time, the simulation time corresponding to the reference point, and the time increment from the present simulation time to the next tick of the repetitive clock signal, a tick being a significant edge of the repetitive clock signal.

34. The Apparatus as recited in claim 33, wherein the means for predicting the occurrence time of the clock-scheduled events includes means for scheduling such events on the time-scheduled event data structure, such that processing the time-scheduled events for the particular simulation time automatically includes processing the clock-scheduled events predicted to occur at the particular simulation time.

35. The Apparatus as recited in claim 33, wherein the time-scheduled event data structure is a first queue, and wherein the clock-scheduled event data structure is a second queue.

36. The Apparatus as recited in claim 33, wherein the processing, by the means for processing, of the time-scheduled and clock-scheduled events for the particular simulation, includes:

(a) treating the events in the time-scheduled event data structure scheduled to occur at the particular simulation time in the time-scheduled event data structure as a current event data structure;

(b) processing the events in the current event data structure;

(c) during processing, causing the means for scheduling to schedule any events for processing at the current simulation time in a pending event data structure;

(d) after all the events in the pending event data structure are processed and the effect of such processing propagated through the model, treating events scheduled in the pending event data structure as events in a new current event data structure for events scheduled for processing at the current simulation time; and (e) repeating (b), (c), and (d) until there are no more events scheduled to be processed at the particular simulation time, and wherein the clock-scheduled events are such that no clock-scheduled events are scheduled in a pending event data structure.

37. The Apparatus as recited in claim 33, wherein the model of the digital circuited is coded in a hardware description language extended to include primitives that provide for scheduling clock based events according to one or more attributes of a clock signal.

38. The Apparatus as recited in claim 37, wherein the primitives are new commands in the hardware description language.

39. The Apparatus as recited in claim 37, wherein the primitives are one or more tasks and callback functions callable from the hardware description language, a task being a section of the model such that when an instance of the model is set up during an initialization step, instances of any tasks in the model are also created, and such that a task can suspend operation of itself at a point in simulation time of the hardware model it is contained in, and resume operation at some future point in simulation time of that hardware model, and a callback function being a section of the model that operates at a single instant in simulation time of the model, a callback function being able to directly invoke from a callback function, or being schedulable to be invoked by a task or a callback function.

* * * * *